(12) United States Patent
Steiner et al.

(10) Patent No.: US 9,954,558 B1
(45) Date of Patent: Apr. 24, 2018

(54) FAST DECODING OF DATA STORED IN A FLASH MEMORY

(71) Applicant: Avago Technologies General IP (Singapore) Pte. Ltd., Yishun (SG)

(72) Inventors: Avi Steiner, Kiriat Motzkin (IL); Avigdor Segal, Netanya (IL); Hanan Weingarten, Herzelia (IL)

(73) Assignee: AVAGO TECHNOLOGIES GENERAL IP (SINGAPORE) PTE. LTD., Singapore (SG)

( * ) Notice: Subject to any disclaimer, the term of this patent is extended or adjusted under 35 U.S.C. 154(b) by 69 days.

(21) Appl. No.: 15/059,397

(22) Filed: Mar. 3, 2016

(51) Int. Cl.
  *H03M 13/37* (2006.01)
  *G06F 11/10* (2006.01)
  *H03M 13/29* (2006.01)
  *G11C 16/26* (2006.01)

(52) U.S. Cl.
  CPC ..... *H03M 13/3784* (2013.01); *G06F 11/1068* (2013.01); *G11C 16/26* (2013.01); *H03M 13/2918* (2013.01)

(58) Field of Classification Search
  CPC .......... H03M 13/2918; H03M 13/3784; G11C 16/26
  See application file for complete search history.

(56) References Cited

U.S. PATENT DOCUMENTS

| | | | |
|---|---|---|---|
| 4,430,701 A | 2/1984 | Christian et al. | |
| 4,463,375 A | 7/1984 | Macovski | |
| 4,584,686 A | 4/1986 | Fritze | |
| 4,589,084 A | 5/1986 | Fling et al. | |
| 4,777,589 A | 10/1988 | Boettner et al. | |
| 4,866,716 A | 9/1989 | Weng | |
| 5,003,597 A | 3/1991 | Merkle | |
| 5,077,737 A | 12/1991 | Leger et al. | |
| 5,297,153 A | 3/1994 | Baggen et al. | |
| 5,305,276 A | 4/1994 | Uenoyama | |
| 5,592,641 A | 1/1997 | Doyle et al. | |

(Continued)

FOREIGN PATENT DOCUMENTS

WO  WO2009053963 A2  4/2009

OTHER PUBLICATIONS

Search Report of PCT Patent Application WO 2009/118720 A3, dated Mar. 4, 2010.

(Continued)

*Primary Examiner* — Steve Nguyen
(74) *Attorney, Agent, or Firm* — Sheridan Ross P.C.

(57) ABSTRACT

A method for fast decoding, the method may include (a) performing a hard read of a group of flash memory cells to provide hard read data; wherein the group of flash memory cells store a codeword that comprises component codes of multiple dimensions; (b) hard decoding the hard read data to provide a hard decoding result; wherein the hard decoding result comprises first suggested values of component codes of at least one dimension of the multiple dimensions; (c) performing at least one additional read attempt of the group of flash memory cells to provide additional data; (d) performing a partial extensiveness soft decoding the additional data, in response to the first suggested values, to provide a soft decoding result; and (e) wherein the soft decoding result comprises second suggested values of component codes of one or more dimensions of the multiple dimensions.

20 Claims, 17 Drawing Sheets

(56) References Cited

U.S. PATENT DOCUMENTS

| | | |
|---|---|---|
| 5,623,620 A | 4/1997 | Alexis et al. |
| 5,640,529 A | 6/1997 | Hasbun |
| 5,657,332 A | 8/1997 | Auclair et al. |
| 5,663,901 A | 9/1997 | Harari et al. |
| 5,724,538 A | 3/1998 | Bryg |
| 5,729,490 A | 3/1998 | Calligaro et al. |
| 5,740,395 A | 4/1998 | Hasbun |
| 5,745,418 A | 4/1998 | Hu et al. |
| 5,778,430 A | 7/1998 | Giovannetti |
| 5,793,774 A | 8/1998 | Usui et al. |
| 5,920,578 A | 7/1999 | Zook et al. |
| 5,926,409 A | 7/1999 | Engh et al. |
| 5,933,368 A | 8/1999 | Hu et al. |
| 5,956,268 A | 9/1999 | Lee |
| 5,956,473 A | 9/1999 | Hu et al. |
| 5,968,198 A | 10/1999 | Balachandran |
| 5,982,659 A | 11/1999 | Irrinki et al. |
| 6,011,741 A | 1/2000 | Harari et al. |
| 6,016,275 A | 1/2000 | Han |
| 6,038,634 A | 3/2000 | Ji et al. |
| 6,081,878 A | 6/2000 | Estakhri |
| 6,094,465 A | 7/2000 | Stein et al. |
| 6,119,245 A | 9/2000 | Hiratsuka |
| 6,182,261 B1 | 1/2001 | Haller et al. |
| 6,192,497 B1 | 2/2001 | Yang et al. |
| 6,195,287 B1 | 2/2001 | Hirano |
| 6,199,188 B1 | 3/2001 | Shen et al. |
| 6,209,114 B1 | 3/2001 | Wolf et al. |
| 6,259,627 B1 | 7/2001 | Wong |
| 6,272,052 B1 | 8/2001 | Miyauchi |
| 6,278,633 B1 | 8/2001 | Wong et al. |
| 6,279,133 B1 | 8/2001 | Vafai et al. |
| 6,301,151 B1 | 10/2001 | Engh et al. |
| 6,370,061 B1 | 4/2002 | Yachareni et al. |
| 6,374,383 B1 | 4/2002 | Weng |
| 6,504,891 B1 | 1/2003 | Chevallier |
| 6,532,169 B1 | 3/2003 | Mann et al. |
| 6,532,556 B1 | 3/2003 | Wong et al. |
| 6,553,533 B2 | 4/2003 | Demura et al. |
| 6,560,747 B1 | 5/2003 | Weng |
| 6,637,002 B1 | 10/2003 | Weng et al. |
| 6,639,865 B2 | 10/2003 | Kwon |
| 6,674,665 B1 | 1/2004 | Mann et al. |
| 6,675,281 B1 | 1/2004 | Oh |
| 6,704,902 B2 | 3/2004 | Shinbashi et al. |
| 6,751,766 B2 | 6/2004 | Guterman et al. |
| 6,772,274 B1 | 8/2004 | Estakhri |
| 6,781,910 B2 | 8/2004 | Smith |
| 6,792,569 B2 | 9/2004 | Cox et al. |
| 6,873,543 B2 | 3/2005 | Smith et al. |
| 6,891,768 B2 | 5/2005 | Smith et al. |
| 6,914,809 B2 | 7/2005 | Hilton et al. |
| 6,915,477 B2 | 7/2005 | Gollamudi et al. |
| 6,952,365 B2 | 10/2005 | Gonzalez et al. |
| 6,961,890 B2 | 11/2005 | Smith |
| 6,968,421 B2 | 11/2005 | Conley |
| 6,990,012 B2 | 1/2006 | Smith et al. |
| 6,996,004 B1 | 2/2006 | Fastow et al. |
| 6,999,854 B2 | 2/2006 | Roth |
| 7,012,835 B2 | 3/2006 | Gonzalez et al. |
| 7,038,950 B1 | 5/2006 | Hamilton et al. |
| 7,068,539 B2 | 6/2006 | Guterman et al. |
| 7,079,436 B2 | 7/2006 | Perner et al. |
| 7,149,950 B2 | 12/2006 | Spencer et al. |
| 7,177,977 B2 | 2/2007 | Chen et al. |
| 7,188,228 B1 | 3/2007 | Chang et al. |
| 7,191,379 B2 | 3/2007 | Adelmann et al. |
| 7,196,946 B2 | 3/2007 | Chen et al. |
| 7,203,874 B2 | 4/2007 | Roohparvar |
| 7,212,426 B2 | 5/2007 | Park |
| 7,290,203 B2 | 10/2007 | Emma et al. |
| 7,292,365 B2 | 11/2007 | Knox |
| 7,301,928 B2 | 11/2007 | Nakabayashi et al. |
| 7,315,916 B2 | 1/2008 | Bennett |
| 7,388,781 B2 | 6/2008 | Litsyn |
| 7,395,404 B2 | 7/2008 | Gorobets |
| 7,441,067 B2 | 10/2008 | Gorobets et al. |
| 7,443,729 B2 | 10/2008 | Li |
| 7,450,425 B2 | 11/2008 | Aritome |
| 7,454,670 B2 | 11/2008 | Kim et al. |
| 7,466,575 B2 | 12/2008 | Shalvi et al. |
| 7,533,328 B2 | 5/2009 | Alrod et al. |
| 7,558,109 B2 | 7/2009 | Brandman et al. |
| 7,593,263 B2 | 9/2009 | Sokolov et al. |
| 7,610,433 B2 | 10/2009 | Randell et al. |
| 7,613,043 B2 | 11/2009 | Cornwell |
| 7,619,922 B2 | 11/2009 | Li |
| 7,697,326 B2 | 4/2010 | Sommer et al. |
| 7,706,182 B2 | 4/2010 | Shalvi et al. |
| 7,716,538 B2 | 5/2010 | Gonzalez |
| 7,804,718 B2 | 9/2010 | Kim |
| 7,805,663 B2 | 9/2010 | Brandman et al. |
| 7,805,664 B1 | 9/2010 | Yang et al. |
| 7,844,877 B2 | 11/2010 | Litsyn et al. |
| 7,911,848 B2 | 3/2011 | Eun |
| 7,961,797 B1 | 6/2011 | Yang et al. |
| 7,975,192 B2 | 7/2011 | Sommer |
| 8,020,073 B2 | 9/2011 | Emma et al. |
| 8,108,590 B2 | 1/2012 | Chow et al. |
| 8,122,328 B2 | 2/2012 | Liu et al. |
| 8,159,881 B2 | 4/2012 | Yang |
| 8,190,961 B1 | 5/2012 | Yang |
| 8,250,324 B2 | 8/2012 | Haas |
| 8,300,823 B2 | 10/2012 | Bojinov |
| 8,305,812 B2 | 11/2012 | Levy |
| 8,327,246 B2 | 12/2012 | Weingarten |
| 8,407,560 B2 | 3/2013 | Ordentlich |
| 8,417,893 B2 | 4/2013 | Khmelnitsky |
| 8,429,498 B1* | 4/2013 | Anholt ............... G06F 11/1048 365/227 |
| 8,990,665 B1* | 3/2015 | Steiner ............... G11C 11/5642 714/769 |
| 8,996,793 B1* | 3/2015 | Steiner ............... G06F 12/0246 711/103 |
| 9,252,816 B1* | 2/2016 | Steiner ............... H03M 13/2909 |
| 9,620,246 B2* | 4/2017 | Lee ............... G11C 29/52 |
| 2001/0034815 A1 | 10/2001 | Dugan et al. |
| 2002/0063774 A1 | 5/2002 | Hillis et al. |
| 2002/0085419 A1 | 7/2002 | Choi |
| 2002/0154769 A1 | 10/2002 | Petersen et al. |
| 2002/0156988 A1 | 10/2002 | Sekibe |
| 2002/0174156 A1 | 11/2002 | Birru |
| 2003/0014582 A1 | 1/2003 | Nakanishi |
| 2003/0065876 A1 | 4/2003 | Lasser |
| 2003/0101404 A1 | 5/2003 | Zhao et al. |
| 2003/0105620 A1 | 6/2003 | Bowen |
| 2003/0177300 A1 | 9/2003 | Jeong |
| 2003/0192007 A1 | 10/2003 | Miller et al. |
| 2004/0015771 A1 | 1/2004 | Lasser et al. |
| 2004/0030971 A1 | 2/2004 | Shibata |
| 2004/0059768 A1 | 3/2004 | Denk |
| 2004/0080985 A1 | 4/2004 | Chang et al. |
| 2004/0153722 A1 | 8/2004 | Lee |
| 2004/0153817 A1 | 8/2004 | Chevallier |
| 2004/0181735 A1 | 9/2004 | Xin |
| 2004/0203591 A1 | 10/2004 | Lee |
| 2004/0210706 A1 | 10/2004 | In et al. |
| 2005/0013165 A1 | 1/2005 | Ban |
| 2005/0018482 A1 | 1/2005 | Cemea et al. |
| 2005/0083735 A1 | 4/2005 | Chen et al. |
| 2005/0117401 A1 | 6/2005 | Chen et al. |
| 2005/0120265 A1 | 6/2005 | Pline et al. |
| 2005/0128811 A1 | 6/2005 | Kato et al. |
| 2005/0138533 A1 | 6/2005 | Le-Bars et al. |
| 2005/0144213 A1 | 6/2005 | Simkins et al. |
| 2005/0144368 A1 | 6/2005 | Chung et al. |
| 2005/0169057 A1 | 8/2005 | Shibata |
| 2005/0172179 A1 | 8/2005 | Brandenberger et al. |
| 2005/0213393 A1 | 9/2005 | Lasser |
| 2005/0243626 A1 | 11/2005 | Ronen |
| 2006/0059406 A1 | 3/2006 | Micheloni et al. |
| 2006/0059409 A1 | 3/2006 | Lee |
| 2006/0064537 A1 | 3/2006 | Oshima |
| 2006/0101193 A1 | 5/2006 | Murin |

(56) References Cited

U.S. PATENT DOCUMENTS

| | | |
|---|---|---|
| 2006/0195651 A1 | 8/2006 | Estakhri |
| 2006/0203587 A1 | 9/2006 | Li et al. |
| 2006/0221692 A1 | 10/2006 | Chen |
| 2006/0248434 A1 | 11/2006 | Radke et al. |
| 2006/0268608 A1 | 11/2006 | Noguchi et al. |
| 2006/0282411 A1 | 12/2006 | Fagin et al. |
| 2006/0284244 A1 | 12/2006 | Forbes |
| 2006/0294312 A1 | 12/2006 | Walmsley |
| 2007/0025157 A1 | 2/2007 | Wan et al. |
| 2007/0063180 A1 | 3/2007 | Asano et al. |
| 2007/0081388 A1 | 4/2007 | Joo |
| 2007/0098069 A1 | 5/2007 | Gordon |
| 2007/0103992 A1 | 5/2007 | Sakui et al. |
| 2007/0104004 A1 | 5/2007 | So et al. |
| 2007/0109858 A1 | 5/2007 | Conley et al. |
| 2007/0124652 A1 | 5/2007 | Litsyn et al. |
| 2007/0140006 A1 | 6/2007 | Chen |
| 2007/0143561 A1 | 6/2007 | Gorobets |
| 2007/0150694 A1 | 6/2007 | Chang et al. |
| 2007/0168625 A1 | 7/2007 | Cornwell et al. |
| 2007/0171714 A1 | 7/2007 | Wu et al. |
| 2007/0171730 A1 | 7/2007 | Ramamoorthy et al. |
| 2007/0180346 A1 | 8/2007 | Murin |
| 2007/0223277 A1 | 9/2007 | Tanaka et al. |
| 2007/0226582 A1 | 9/2007 | Tang et al. |
| 2007/0226592 A1 | 9/2007 | Radke |
| 2007/0228449 A1 | 10/2007 | Takano et al. |
| 2007/0253249 A1 | 11/2007 | Kang et al. |
| 2007/0253250 A1 | 11/2007 | Shibata |
| 2007/0263439 A1 | 11/2007 | Cornwell et al. |
| 2007/0266291 A1 | 11/2007 | Toda et al. |
| 2007/0271494 A1 | 11/2007 | Gorobets |
| 2007/0297226 A1 | 12/2007 | Mokhlesi |
| 2008/0010581 A1 | 1/2008 | Alrod et al. |
| 2008/0028014 A1 | 1/2008 | Hilt et al. |
| 2008/0049497 A1 | 2/2008 | Mo |
| 2008/0055989 A1 | 3/2008 | Lee |
| 2008/0082897 A1 | 4/2008 | Brandman et al. |
| 2008/0092026 A1 | 4/2008 | Brandman et al. |
| 2008/0104309 A1 | 5/2008 | Cheon et al. |
| 2008/0112238 A1 | 5/2008 | Kim |
| 2008/0116509 A1 | 5/2008 | Harari et al. |
| 2008/0126686 A1 | 5/2008 | Sokolov et al. |
| 2008/0127104 A1 | 5/2008 | Li |
| 2008/0128790 A1 | 6/2008 | Jung |
| 2008/0130341 A1 | 6/2008 | Shalvi et al. |
| 2008/0137413 A1 | 6/2008 | Kong et al. |
| 2008/0137414 A1 | 6/2008 | Park et al. |
| 2008/0141043 A1 | 6/2008 | Flynn et al. |
| 2008/0148115 A1 | 6/2008 | Sokolov |
| 2008/0158958 A1 | 7/2008 | Shalvi et al. |
| 2008/0159059 A1 | 7/2008 | Moyer |
| 2008/0162079 A1 | 7/2008 | Astigarraga et al. |
| 2008/0168216 A1 | 7/2008 | Lee |
| 2008/0168320 A1 | 7/2008 | Cassuto et al. |
| 2008/0181001 A1 | 7/2008 | Shalvi |
| 2008/0198650 A1 | 8/2008 | Shalvi et al. |
| 2008/0198652 A1 | 8/2008 | Shalvi et al. |
| 2008/0201620 A1 | 8/2008 | Gollub |
| 2008/0209114 A1 | 8/2008 | Chow et al. |
| 2008/0219050 A1 | 9/2008 | Shalvi et al. |
| 2008/0225599 A1 | 9/2008 | Chae |
| 2008/0250195 A1 | 10/2008 | Chow et al. |
| 2008/0263262 A1 | 10/2008 | Sokolov et al. |
| 2008/0282106 A1 | 11/2008 | Shalvi et al. |
| 2008/0285351 A1 | 11/2008 | Shlick et al. |
| 2008/0301532 A1 | 12/2008 | Uchikawa et al. |
| 2009/0024905 A1 | 1/2009 | Shalvi et al. |
| 2009/0043951 A1 | 2/2009 | Shalvi et al. |
| 2009/0046507 A1 | 2/2009 | Aritome |
| 2009/0072303 A9 | 3/2009 | Prall et al. |
| 2009/0091979 A1 | 4/2009 | Shalvi |
| 2009/0103358 A1 | 4/2009 | Sommer et al. |
| 2009/0106485 A1 | 4/2009 | Anholt |
| 2009/0113275 A1 | 4/2009 | Chen et al. |
| 2009/0125671 A1 | 5/2009 | Flynn |
| 2009/0132755 A1 | 5/2009 | Radke |
| 2009/0027961 A1 | 6/2009 | Park |
| 2009/0144598 A1 | 6/2009 | Yoon |
| 2009/0144600 A1 | 6/2009 | Perlmutter et al. |
| 2009/0150599 A1 | 6/2009 | Bennett |
| 2009/0150748 A1 | 6/2009 | Egner et al. |
| 2009/0157964 A1 | 6/2009 | Kasorla et al. |
| 2009/0158126 A1 | 6/2009 | Perlmutter et al. |
| 2009/0168524 A1 | 7/2009 | Golov et al. |
| 2009/0187803 A1 | 7/2009 | Anholt et al. |
| 2009/0199074 A1 | 8/2009 | Sommer |
| 2009/0213653 A1 | 8/2009 | Perlmutter et al. |
| 2009/0213654 A1 | 8/2009 | Perlmutter et al. |
| 2009/0228761 A1 | 9/2009 | Perlmutter et al. |
| 2009/0240872 A1 | 9/2009 | Perlmutter et al. |
| 2009/0282185 A1 | 11/2009 | Van Cauwenbergh |
| 2009/0282186 A1 | 11/2009 | Mokhlesi |
| 2009/0287930 A1 | 11/2009 | Nagaraja |
| 2009/0300269 A1 | 12/2009 | Radke et al. |
| 2009/0323942 A1 | 12/2009 | Sharon |
| 2010/0005270 A1 | 1/2010 | Jiang |
| 2010/0025811 A1 | 2/2010 | Bronner et al. |
| 2010/0030944 A1 | 2/2010 | Hinz |
| 2010/0058146 A1 | 3/2010 | Weingarten et al. |
| 2010/0064096 A1 | 3/2010 | Weingarten et al. |
| 2010/0088557 A1 | 4/2010 | Weingarten et al. |
| 2010/0091535 A1 | 4/2010 | Sommer et al. |
| 2010/0095186 A1 | 4/2010 | Weingarten |
| 2010/0110787 A1 | 5/2010 | Shalvi et al. |
| 2010/0115376 A1 | 5/2010 | Shalvi et al. |
| 2010/0122113 A1 | 5/2010 | Weingarten et al. |
| 2010/0124088 A1 | 5/2010 | Shalvi et al. |
| 2010/0131580 A1 | 5/2010 | Kanter et al. |
| 2010/0131806 A1 | 5/2010 | Weingarten et al. |
| 2010/0131809 A1 | 5/2010 | Katz |
| 2010/0131826 A1 | 5/2010 | Shalvi et al. |
| 2010/0131827 A1 | 5/2010 | Sokolov et al. |
| 2010/0131831 A1 | 5/2010 | Weingarten et al. |
| 2010/0146191 A1 | 6/2010 | Katz |
| 2010/0146192 A1 | 6/2010 | Weingarten et al. |
| 2010/0174853 A1 | 7/2010 | Lee |
| 2010/0180073 A1 | 7/2010 | Weingarten et al. |
| 2010/0172179 A1 | 8/2010 | Gorobets et al. |
| 2010/0199149 A1* | 8/2010 | Weingarten ......... G06F 11/1068 714/773 |
| 2010/0211724 A1 | 8/2010 | Weingarten |
| 2010/0211833 A1 | 8/2010 | Weingarten |
| 2010/0211856 A1 | 8/2010 | Weingarten |
| 2010/0241793 A1 | 9/2010 | Sugimoto |
| 2010/0246265 A1 | 9/2010 | Moschiano et al. |
| 2010/0251066 A1 | 9/2010 | Radke |
| 2010/0253555 A1* | 10/2010 | Weingarten ......... G06F 11/1068 341/51 |
| 2010/0257309 A1 | 10/2010 | Barsky et al. |
| 2010/0269008 A1 | 10/2010 | Leggette |
| 2010/0149881 A1 | 11/2010 | Lee et al. |
| 2010/0293321 A1 | 11/2010 | Weingarten |
| 2010/0318724 A1 | 12/2010 | Yeh |
| 2011/0051521 A1 | 3/2011 | Levy et al. |
| 2011/0055461 A1 | 3/2011 | Steiner et al. |
| 2011/0093650 A1 | 4/2011 | Kwon et al. |
| 2011/0096612 A1 | 4/2011 | Steiner et al. |
| 2011/0099460 A1 | 4/2011 | Dusija et al. |
| 2011/0119562 A1 | 5/2011 | Steiner et al. |
| 2011/0153919 A1 | 6/2011 | Sabbag |
| 2011/0161775 A1 | 6/2011 | Weingarten |
| 2011/0194353 A1 | 8/2011 | Hwang |
| 2011/0209028 A1 | 8/2011 | Post |
| 2011/0214029 A1 | 9/2011 | Steiner et al. |
| 2011/0214039 A1* | 9/2011 | Steiner ................ G06F 11/1012 714/797 |
| 2011/0246792 A1 | 10/2011 | Weingarten |
| 2011/0246852 A1 | 10/2011 | Sabbag |
| 2011/0252187 A1 | 10/2011 | Segal et al. |
| 2011/0252188 A1 | 10/2011 | Weingarten |
| 2011/0271043 A1 | 11/2011 | Segal et al. |
| 2011/0302428 A1 | 12/2011 | Weingarten |
| 2012/0001778 A1 | 1/2012 | Steiner et al. |

(56) References Cited

U.S. PATENT DOCUMENTS

| | | | |
|---|---|---|---|
| 2012/0005554 A1 | 1/2012 | Steiner et al. | |
| 2012/0005558 A1 | 1/2012 | Steiner et al. | |
| 2012/0005560 A1 | 1/2012 | Steiner et al. | |
| 2012/0008401 A1 | 1/2012 | Katz et al. | |
| 2012/0008414 A1 | 1/2012 | Katz et al. | |
| 2012/0017136 A1 | 1/2012 | Ordentlich et al. | |
| 2012/0051144 A1 | 3/2012 | Weingarten et al. | |
| 2012/0063227 A1 | 3/2012 | Weingarten et al. | |
| 2012/0066441 A1 | 3/2012 | Weingarten | |
| 2012/0110250 A1 | 5/2012 | Sabbag et al. | |
| 2012/0124273 A1 | 5/2012 | Goss et al. | |
| 2012/0246391 A1 | 9/2012 | Meir | |
| 2013/0215678 A1* | 8/2013 | Yang | G06F 11/1048 365/185.03 |
| 2015/0186210 A1* | 7/2015 | Tsai | G06F 11/1068 714/764 |
| 2015/0349807 A1* | 12/2015 | Vernon | H03M 13/353 714/774 |

OTHER PUBLICATIONS

Search Report of PCT Patent Application WO 2009/095902 A3, dated Mar. 4, 2010.
Search Report of PCT Patent Application WO 2009/078006 A3, dated Mar. 4, 2010.
Search Report of PCT Patent Application WO 2009/074979 A3, dated Mar. 4, 2010.
Search Report of PCT Patent Application WO 2009/074978 A3, dated Mar. 4, 2010.
Search Report of PCT Patent Application WO 2009/072105 A3, dated Mar. 4, 2010.
Search Report of PCT Patent Application WO 2009/072104 A3, dated Mar. 4, 2010.
Search Report of PCT Patent Application WO 2009/072103 A3, dated Mar. 4, 2010.
Search Report of PCT Patent Application WO 2009/072102 A3, dated Mar. 4, 2010.
Search Report of PCT Patent Application WO 2009/072101 A3, dated Mar. 4, 2010.
Search Report of PCT Patent Application WO 2009/072100 A3, dated Mar. 4, 2010.
Search Report of PCT Patent Application WO 2009/053963 A3, dated Mar. 4, 2010.
Search Report of PCT Patent Application WO 2009/053962 A3, dated Mar. 4, 2010.
Search Report of PCT Patent Application WO 2009/053961 A3, dated Mar. 4, 2010.
Search Report of PCT Patent Application WO 2009/037697 A3, dated Mar. 4, 2010.
Yani Chen, Kcshab K. Parhi, "Small Area Parallel Chien Search Architectures for Long BCH Codes", Ieee Transactions on Very Large Scale Integration(VLSI) Systems, vol. 12, No. 5, May 2004.
Yuejian Wu, "Low Power Decoding of BCH Codes", Nortel Networks, Ottawa, Ont., Canada, in Circuits and systems, 2004. ISCAS '04. Proceeding of the 2004 International Symposium on Circuits and Systems, published May 23-26, 2004, vol. 2, pp. II-369-II-372 vol. 2.
Michael Purser, "Introduction to Error Correcting Codes", Artech House Inc., 1995.
Ron M. Roth, "Introduction to Coding Theory", Cambridge University Press, 2006.
Akash Kumar, Sergei Sawitzki, "High-Throughput and Low Power Architectures for Reed Solomon Decoder", (a.kumar.at tue.nl, Eindhoven University of Technology and sergei.sawitzki at philips. com), Oct. 2005.
Todd K.Moon, "Error Correction Coding Mathematical Methods and Algorithms", A John Wiley & Sons, Inc., 2005.
Richard E. Blahut, "Algebraic Codes for Data Transmission", Cambridge University Press, 2003.
David Esseni, Bruno Ricco, "Trading-Off Programming Speed and Current Absorption in Flash Memories with the Ramped-Gate Programming Technique", Ieee Transactions on Electron Devices, vol. 47, No. 4, Apr. 2000.
Giovanni Campardo, Rino Micheloni, David Novosel, "VLSI-Design of Non-Volatile Memories", Springer Berlin Heidelberg New York, 2005.
John G. Proakis, "Digital Communications", 3rd ed., New York: McGraw-Hill, 1995.
J.M. Portal, H. Aziza, D. Nee, "EEPROM Memory: Threshold Voltage Built in Self Diagnosis", ITC International Test Conference, Paper 2.1, Feb. 2005.
J.M. Portal, H. Aziza, D. Nee, "EEPROM Diagnosis Based on Threshold Voltage Embedded Measurement", Journal of Electronic Testing: Theory and Applications 21, 33-42, 2005.
G. Tao, A. Scarpa, J. Dijkstra, W. Stidl, F. Kuper, "Data retention prediction for modern floating gate non-volatile memories", Microelectronics Reliability 40 (2000), 1561-1566.
T. Hirncno, N. Matsukawa, H. Hazama, K. Sakui, M. Oshikiri, K. Masuda, K. Kanda, Y. Itoh, J. Miyamoto, "A New Technique for Measuring Threshold Voltage Distribution in Flash EEPROM Devices", Proc. IEEE 1995 Int. Conference on Microelectronics Test Structures, vol. 8, Mar. 1995.
Boaz Eitan, Guy Cohen, Assaf Shappir, Eli Lusky, Amichai Givant, Meir Janai, Ilan Bloom, Yan Polansky, Oleg Dadashev, Avi Lavan, Ran Sahar, Eduardo Maayan, "4-bit per Cell NROM Reliability", Appears on the website of Saifun.com , 2005.
Paulo Cappelletti, Clara Golla, Piero Olivo, Enrico Zanoni, "Flash Memories", Kluwer Academic Publishers, 1999.
JEDEC Standard, "Stress-Test-Driven Qualification of Integrated Circuits", JEDEC Solid State Technology Association. JEDEC Standard No. 47F pp. 1-26, Dec. 2007.
Dempster, et al., "Maximum Likelihood from Incomplete Data via the EM Algorithm", Journal of the Royal Statistical Society. Series B (Methodological), vol. 39, No. 1 (1997), pp. 1-38.
Mielke, et al., "Flash EEPROM Threshold Instabilities due to Charge Trapping During Program/Erase Cycling", IEEE Transactions on Device and Materials Reliability, vol. 4, No. 3, Sep. 2004, pp. 335-344.
Daneshbeh, "Bit Serial Systolic Architectures for Multiplicative Inversion and Division over GF (2)", A thesis presented to the University of Waterloo, Ontario, Canada, 2005, pp. 1-118.
Chen, Formulas for the solutions of Quadratic Equations over GF (2), IEEE Trans. Inform. Theory, vol. IT-28, No. 5, Sep. 1982, pp. 792-794.
Berlekamp et al., "On the Solution of Algebraic Equations over Finite Fields", Inform. Cont. 10, Oct. 1967, pp. 553-564.

* cited by examiner

FAST DECODING OF DATA STORED IN A FLASH MEMORY

FIELD

The field of art to which the invention pertains is the field of flash memory cells.

BACKGROUND

Hard decoding is a decoding process that receives a single bit precision codeword of binary input of zeros and/or ones, and tries to correct errors (bit flips). Soft decoding is a decoding process that receives a codeword of binary value as well as an indication about the reliability of the binary value.

FIG. 1 demonstrates a voltage threshold distribution 10 of a triple-level cell (TLC) flash memory. Three page types are defined for the 8-level programming A most significant bit (MSB) page type, which is also called lower page, can be read using thresholds $T_0$ 20 and $T_4$ 24, a central significance bit (CSB), which is also called middle page, can be read using thresholds $T_1$ 21, $T_3$ 23 and $T_5$ 25, and a lower significance bit (LSB), which is also called upper page, can be read using thresholds $T_2$ 22 and $T_6$ 26. When the number of errors is sufficiently low a single page read can be used for recovering the original payload data, and this operation is called hard decoding. This is since the input to the decoder is only a logical value of the bit sampled once from the NAND (0/1).

In case the hard decoding fails, a digital signal processing (DSP) unit may perform multiple reads to obtain soft information at the decoder input. From the multiple reads the soft information may be computed, in the form of log-likelihood ratio (LLR), for every codeword bit. The overhead of performing multiple reads for a single codeword may have a significant impact on the overall latency for completing the read transaction. It is therefore desired to minimize the number of reads and attempt decoding with a limited soft information resolution. The example of FIG. 1 shows an erasure sampling (sampling thresholds 11, 12, 13 and 14) where the LSB page is read using only 2 read operations.

The sampling thresholds 11, 12, 13 and 14 are around centers of $T_2$ and $T_6$. The decoder input has 3-levels, which is why this sampling is called 1.5-bit sampling resolution. These 3 input levels may be mapped to LLR values {-1, 0, 1} where bits which have LLR=0 are considered as erasure bits, with equal probability of 0 and 1. In this invention we will describe methods for fast decoding of such input with utilization of hard decoding within soft decoding iterations.

Another voltage threshold distribution 30 is demonstrated in FIG. 2 where a CSB page is sampled with 3 read operations (triplet of read thresholds 31 near $T_1$, triples 32 near $T_3$ and triplet 33 near $T_5$. This may be required when hard decoding fails and 1.5-bit sampling is inefficient. The 3 read operations provides decoder input with 4 sampling levels, which may be mapped to LLR values {-2, -1, 1, 2} where bits which have |LLR|=1 are considered low reliability bits, and the sign of the LLRs is the hard decision input to the decoder.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

DETAILED DESCRIPTION OF THE DRAWINGS

Figure 1:
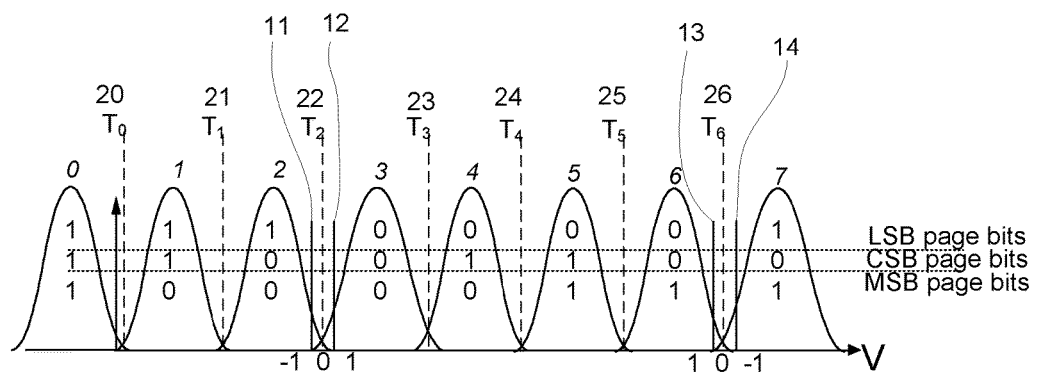
FIG. 1 illustrates a prior art threshold voltage distribution.

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method and should be applied mutatis mutandis to a non-transitory computer readable medium that stores instructions that once executed by a computer result in the execution of the method.

Any reference in the specification to a system should be applied mutatis mutandis to a method that may be executed by the system and should be applied mutatis mutandis to a non-transitory computer readable medium that stores instructions that may be executed by the system.

Any reference in the specification to a non-transitory computer readable medium should be applied mutatis mutandis to a system capable of executing the instructions stored in the non-transitory computer readable medium and should be applied mutatis mutandis to method that may be executed by a computer that reads the instructions stored in the non-transitory computer readable medium.

According to various embodiments of the invention there may be provided methods, flash memory controllers and non-transitory computer readable media for decoding that are fast and efficient—especially in a raw bit error rate in which there is a transition between hard decoding to soft decoding.

The methods, flash memory controllers and non-transitory computer readable media may maintain high throughput at high raw bit error rate (RBER), where hard decoding is not always effective.

The methods, flash memory controllers and non-transitory computer readable media may exhibit low latency and achieve a steady performance for higher endurance and retention stresses.

The methods, flash memory controllers and non-transitory computer readable media may include hard decoding based and if the hard decoding fail proceed by performing one or more additional read operations in order to obtain soft information of 1.5 bit-precision or 2-bit precision. The one or more additional read operations may be followed by decoding with combined hard and soft iterations, where the hard-decoding failed components are decoded via soft decoding.

According to an embodiment of the invention when controller is aware of BER range in which hard decoding is not effective to begin with—the controller may skip the hard decode attempt and directly do 1.5/2 bit sampling and go to hard-soft combined decoding.

The methods, flash memory controllers and non-transitory computer readable media may involve performing fast soft decoding of a component. A fast soft decoding may include, at least one out of (a) A strictly limited hypotheses enumeration list, (b) for the limited enumeration list allow early termination if sum-LLR of last hypothesis and solution satisfy a threshold.

The methods, flash memory controllers and non-transitory computer readable media may involve hard decoding of a component code (may be a special case of soft decoding): (a) Compute sum-LLR of hard decoding solution and compare it to a threshold, and only if not satisfied, proceed to soft decoding. (b) Change the sum-LLR threshold every hard iteration to accept more and more solutions with hard decoding.

The methods, flash memory controllers and non-transitory computer readable media may involve, when applying multi-dimensional decoding, performing soft decoding only on a limited number of component codes in a single (or multiple dimensions) and then proceed with fast iterative hard decoding as long as there is progress in decoding.

The methods, flash memory controllers and non-transitory computer readable media may minimize the additional overhead of soft decoding and try to decode as many component codes as possible with hard decoding.

The methods, flash memory controllers and non-transitory computer readable media may involve performing hard decoding before soft decoding at "high" effort (as to try and avoid soft sampling). If the hard fails and soft sampling is done the hard decoding iterations within the soft decoding may be high performance iterations (e.g. without intersections decoding and without outer decoding).

According to an embodiment of the invention the methods, flash memory controllers and non-transitory computer readable media are applied in the context of multi-dimensional codes.

Multi-dimensional codes are widely used due to their potential efficiency. In NAND flash memory systems the reliability requirement dictates operation in extremely low output bit error rate (BER), for example, this can be output BER<ten by the power of minus fifteen, at a lowest possible latency. In order to achieve these goals it is required to use a single read (hard) decoding most of the time. In cases that hard decoding fails a soft-sampling and decoding has to be used. In order to achieve lowest latency this work presents novel methods for fast soft-decoding, which utilizes hard decoding of some components of the multi-dimensional code within the soft decoding flow.

Various multi-dimensional decoding and encoding methods are illustrated in the following US patents and US patent applications—all being incorporated herein by reference: U.S. patent application Ser. No. 12/509,748 filing date Jul. 27, 2009 titled ENCODING METHOD AND SYSTEM, DECODING METHOD AND SYSTEM; U.S. Pat. No. 8,341,502 titled SYSTEM AND METHOD FOR MULTI-DIMENSIONAL DECODING, U.S. Pat. No. 8,510,639 titled SYSTEM AND METHOD FOR MULTI DIMENSIONAL ENCODING AND DECODING, and U.S. Pat. No. 9,136,876 titled SIZE LIMITED MULTI-DIMENSIONAL DECODING.

Figure 3:
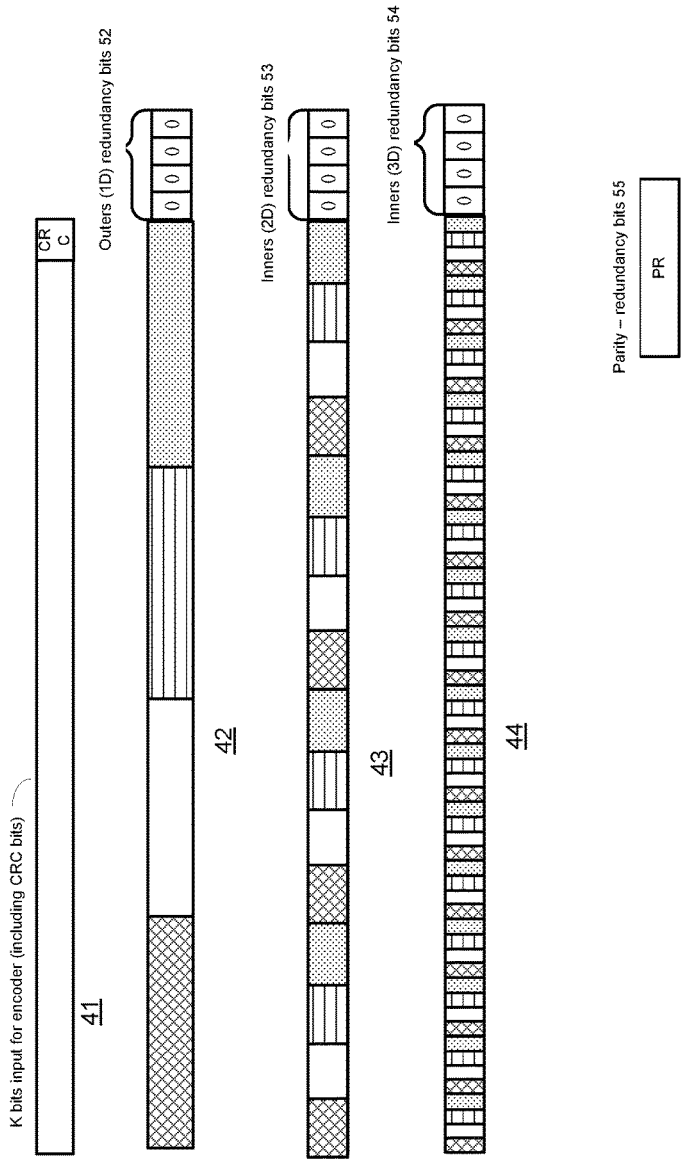
FIGS. 3-5 illustrates a prior art multi-dimensional code components and encoder.

FIG. 3 illustrates a data payload and a CRC (collectively denoted 41) as well as code components of first, second and third dimensions 42, 43 and 44, their payloads 52, 53, 54 and an additional payload 55.

Figure 4:
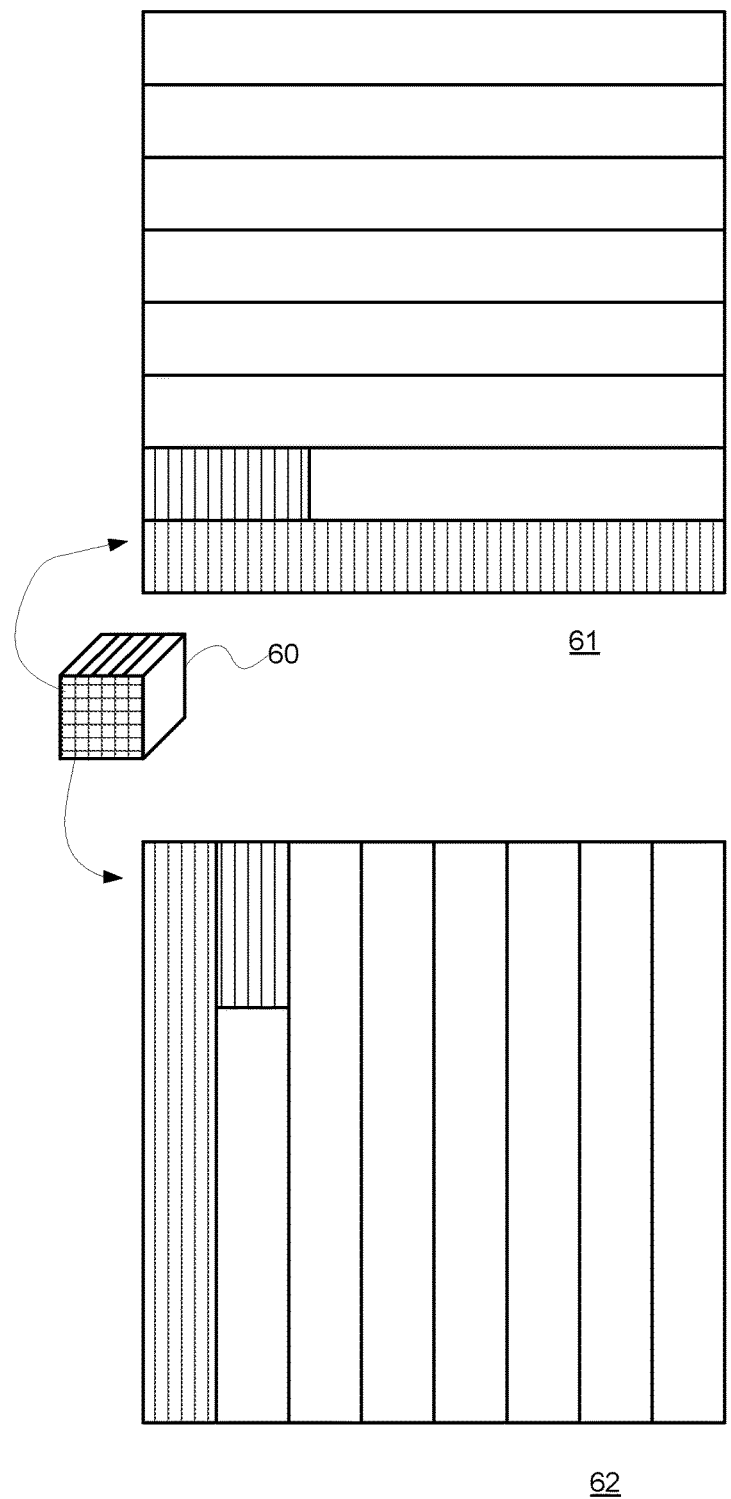

FIG. 4 illustrates a three dimensional encoded data unit 60 that includes folded component code—a folded component code 61 that spans along a non-integer numbers of rows 61 and a folded component code 62 that spans along a non-integer numbers of columns.

Figure 5:
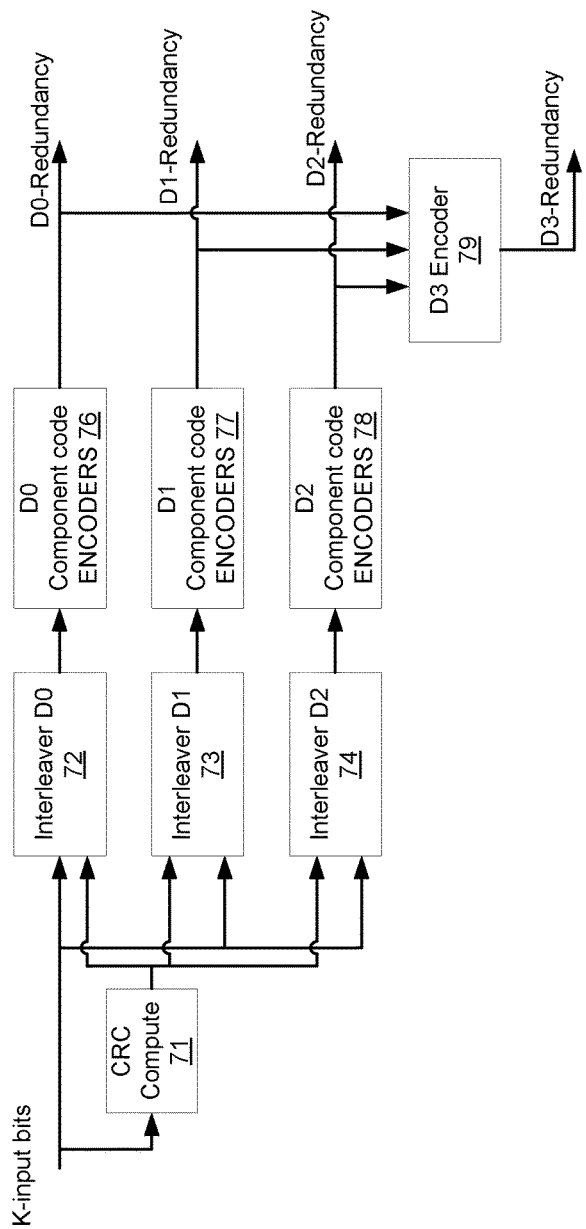

FIG. 5 illustrates an encoder 70 that receives k-input bits, feeds these input bits to interleaver D0 72, interleaver D1 73 and Interleaver D2 74 (of first till third dimensions respectively).

CRC computer 71 receives the k-input bits and feeds them to interleaver D1 73 and Interleaver D2 74.

Interleaver D0 72, interleaver D1 73 and Interleaver D2 74 are followed by D0 component code encoders 76, D1 component code encoders 77 and D2 component code encoders 78 (of first till third dimensions respectively) that output D0 redundancy bits, D1 redundancy bits and D2 redundancy bits (respectively). D0 redundancy bits, D1 redundancy bits and D2 redundancy bits are further encoded by D3 encoder 79 to provide D3 redundancy bits.

Multi-dimensional codes for the NAND flash memory systems are utilized here for their promise in reliability at high endurance, together with a low power and low latency implementations. In order to achieve lowest latency a single read operation is usually carried out, and hard decoding is used to recover the original data. In cases that hard decoding fails a soft-sampling and decoding has to be used. In order to achieve very low decode latency, according to an embodiment of this invention, fast hard and soft-decoding is done jointly within the iterative multi-dimensional code decoding of soft input samples.

According to embodiments of the invention it is suggested to use fast activations of hard decoding along with embedded soft decoding operations which minimize the decoding complexity such that reliable decoding can be achieved within a limited latency. This approach is highly efficient in the RBER range that hard decoding may be successful with a relatively high probability, and therefore when hard decoding fails it is very efficient to perform combined soft and hard decoding in terms of latency and complexity. Several methods are introduces in this invention for minimizing the additional latency involved in soft decoding of the multi-dimensional code components while maximizing the usage of hard decoding.

The hard decoding may be applied on multi-dimensional codes that may be multi-dimensional folded BCH codes with encoding scheme as disclosed in U.S. patent application Ser. No. 12/509,748 filing date Jul. 27, 2009 titled ENCODING METHOD AND SYSTEM, DECODING METHOD AND SYSTEM which is incorporated herein by reference.

A basic flow of the multi-dimensional iterative hard decoder may include attempting to decode (hard decoding) all the component codes, at each dimension. At the first iteration decoding may start with inner codes which might have fast decoding capabilities and if decoding succeeds without outer and intersections decoding, the decoder may complete the decoding within a very short latency. The first several iterations may include inners decoding only, followed by outers decoding if required, which may be followed by intersections decoding.

On some cases during the hard iterative decoding it may be beneficial to perform a complexity limited intersections decoding. A possible scenario for using intersections decoding is when there are still some decoder packets (or component codes) which are not solved, and there was no progress of the hard iterative decoding. An example of intersection bit-set is the information bits associated with multiple distinct packets of different dimensions. The more packets used in every dimension, the smaller is the bit-set of intersection. For multi-dimensional folded BCH codes, the intersection bit-set length may change, as the component codes on the same dimension may differ in their length.

The main steps of intersections decoding include:
1) Mapping of bit-sets which are obtained by intersections of non-solved packets on different dimensions.
2) Limit the intersections bit-sets list size.
3) Determine the dimensions for which decoding is to be applied.
4) Determine the number of bits for enumeration (Nb)—this specifies the enumeration complexity.
5) For every selected intersection set enumerate over the intersection bits, where every time another bit (or bits) is (are) inverted, and attempt decoding the corresponding component codes on the selected dimensions. This enables correcting t+Nb errors for a single component code.
6) Accept the inversion of Nb bits (of an intersection bit-set) if the number of successfully solved packets exceeds some threshold.

Using the results of outer decoding and intersections' decoding, and if decoding did not succeed yet, another iteration is performed by performing further inner decoding iterations.

Soft Decoding Overview

Soft decoding relates to the decoding using soft input information, and providing hard output associated with the corrected information bits.

For soft decoding of a BCH component code (also termed as packet) soft information per bit is required. This is obtained by performing multiple reads from the Flash, where each read operation uses different read thresholds.

The read thresholds must be configured such that soft metrics, called LLR, can be computed per bit. The definition of an LLR is $$LLR(b_i) = \log\left(\frac{P(b_i = 1)}{P(b_i = 0)}\right) \quad (1)$$

Where $b_i$ is the i-th bit of some page. The LLR expression can be substantially simplified, for an additive white Gaussian noise (AWGN) channel model. The AWGN is also a good approximation in many cases for the Flash voltage threshold distribution. By assuming an AWGN channel, $$P(b_i | y) = \frac{1}{\sqrt{2\pi\sigma^2}} \exp\left(-\frac{(y - b_i)^2}{2\sigma^2}\right) \quad (2)$$

Where y is the AWGN channel output. It is straightforward to show that the LLR($b_i$) becomes $$LLR(b_i) = \frac{2y}{\sigma^2} \quad (3)$$

Where the LLR per bit is created during the multiple Flash reads, as a quantized version of an AWGN channel. The quantization level per threshold is directly determined by the number of reads, as the base-two logarithm of the read counter. Once, the multiple reads have been performed, and LLRs are available for all codeword bits, the decoding process may begin.

Iterative soft decoding includes the process of performing soft decoding on some of the code components, and applying the most likely corrections (under different conditions, as will be elaborated here). On some code components it may be desired to perform only hard decoding. An example for such code can be a 3D code where the outer components are BCH codes which correct t>4 errors. If this code has inner-1 and inner-2 BCH components with decoding capability of t<4, then soft decoding may be efficiently implemented here (in terms of computational complexity, and hardware implementation).

List-Sphere Soft Decoding of a Single Component Code—Overview

Soft decoding of a single component code may consist of the following main steps:
a. Sort component indices from the least reliable to the $N^{th}$ least reliable bit. The least reliable bits may be those having lowest |LLR($b_i$)|, i.e. lower absolute value LLR.
b. Choose error bits' hypotheses according to minimal sum LLR from within the sorted indices.
c. For every hypothesis, perform hard decoding.
d. For every hypothesis with a valid hard decoding solution (i.e. miss-correction=0), compute $$\text{score} = \sum_{i \in Hyp} |LLR(b_i)| \quad (4)$$

where Hyp corresponds to the group of inverted bits and the hard decoding solution indices. These together suggest a decoding hypothesis.

e. Save the solution with the lowest score as the most likely candidate, and save also the second best hypothesis, with the second lowest score.

For efficiently decoding a BCH component code a decoding engine may include a syndrome update module, which is performed according to the error hypothesis, then for codes with t≤4 the error locating polynomial (ELP) may be efficiently generated, and the ELP may also be efficiently solved. In case the decoding is successful (i.e. missCorrection=0) for a certain hypothesis, the sum-LLR, as in (4), is computed, and a decision on whether or not to apply the correction can be made by the decoder. Conditions for applying the soft suggested corrections are disclosed here.

The process described above is done over a set of pre-defined hypotheses, and usually the hypothesis with the lowest score is considered as the most likely valid correction. This correction will be implemented in case it complies with several conditions as will be described next. In cases where many errors exist, the nearest valid codeword in the sense of minimal score as computed in (4) may be a false correction. In order to reduce probability of accepting false corrections, an iterative decoding process is used, where after each dimension decoding, only a subset of suggested correction hypotheses are accepted. The subset is determined by the more likely hypotheses, e.g. those with a minimal score as computed in (4), out of all component codes that were processed in the current dimension. These selected corrections are implemented, and then soft decoding on the other dimension is done, by repeating the same steps described above. Some of the steps were already introduced in U.S. patent application Ser. No. 12/509,748 filing date Jul. 27, 2009 titled ENCODING METHOD AND SYSTEM, DECODING METHOD AND SYSTEM and U.S. Pat. No. 8,341,502 titled SYSTEM AND METHOD FOR MULTI-DIMENSIONAL DECODING for soft decoding of multi-dimensional codes.

In order have a meaningful impact of every accepted correction during the per component decoding, the decoder may use a mechanism of LLR clipping, which changes to values of the LLRs within the corrected component code to a maximal value, such that the soft decoder of other components is not likely to change any of the bits which belong to an already corrected component code, like introduced in U.S. patent application Ser. No. 12/509,748 filing date Jul. 27, 2009 titled ENCODING METHOD AND SYSTEM, DECODING METHOD AND SYSTEM and U.S. Pat. No. 8,341,502 titled SYSTEM AND METHOD FOR MULTI-DIMENSIONAL DECODING Soft Erasure Decoding—Overview A soft decoding flow may include soft erasure decoding within a decoding flow. A flash controller issues a soft read command which requires sampling at multiple thresholds. The DSP assigns reliability values per cell following the soft read process. Then the decoder may receive soft input which may be represented by LLR per bit. During the soft decoding a soft erasure decoding strategy is used, as disclosed in this invention. The soft erasure decoding, as disclosed, allows a fast throughput implementation for soft decoding, and a higher BER successful decoding.

BCH Decoding Overview

In order to understand the context of soft erasure decoding we review the elementary steps of BCH decoding. BCH codes are linear cyclic error correction codes, i.e. each cyclic shift of a codeword is also a codeword, and linear combination of a codeword is also a codeword, this property allows the construction of G. The encoder can be described in terms of a generator matrix G, which is a collection of codewords that span the whole codebook. Encoding process is comprised of a matrix multiplication $\underline{c}=\underline{m}G$, Where m is the message vector of length k and $\underline{c}$ is the codeword vector of length n, and G is k×n.

The decoding comprises of syndrome decoding, i.e. there exists a parity check matrix H which has the following property $GH^T=0$, it follows that $\underline{c}H^T=\underline{m}GH^T=0$. The decoder computes the syndrome vectors using the parity check matrix by $\underline{s}=\underline{r}H^T=\underline{c}H^T+\underline{e}H^T=0+\underline{e}H^T$, where e is an error indicator vector, i.e. contains '1' where the original codeword $\underline{c}$ had bit flips, or equivalently $\underline{r}=\underline{c}+\underline{e}$.

An example for a parity check matrix H, defined over a finite field, Galois Field (GF) GF ($2^{15}$):

$$H = n-k \left\{ \begin{pmatrix} \alpha^{(2\cdot0+1)\cdot(n-1)} & \alpha^{(2\cdot0+1)\cdot(n-2)} & \cdots & \alpha^{(2\cdot0+1)\cdot0} \\ \alpha^{(2\cdot1+1)\cdot(n-1)} & \alpha^{(2\cdot1+1)\cdot(n-2)} & \cdots & \alpha^{(2\cdot1+1)\cdot0} \\ \alpha^{(2\cdot2+1)\cdot(n-1)} & \alpha^{(2\cdot2+1)\cdot(n-2)} & \cdots & \alpha^{(2\cdot2+1)\cdot0} \\ \vdots & \vdots & \cdots & \vdots \\ \alpha^{(2\cdot59+1)\cdot(n-1)} & \alpha^{(2\cdot59+1)\cdot(n-2)} & \cdots & \alpha^{(2\cdot59+1)\cdot0} \end{pmatrix} \right. \overbrace{\phantom{xxxxxxxxxxxxxxxxxxxxxxxxxx}}^{n} \quad (5)$$

Where $\alpha \in GF(2^{15})$, and the syndrome elements can be computed by $$s_j = \sum_{i=1}^{n} c_i \cdot \alpha^{(2j+1)\cdot(n-i)} \text{ for } j = 0, \ldots, 59. \quad (6)$$

The $i^{th}$ impact syndrome vector is the $i^{th}$ column vector of H of length n−k, which corresponds to the impact of the $i^{th}$ codeword bit $c_i$ on the code syndrome. From the example above, the $i^{th}$ impact syndrome is given by $$\underline{s}_i = \begin{bmatrix} \alpha^{(2\cdot0+1)\cdot(n-i)} \\ \alpha^{(2\cdot1+1)\cdot(n-i)} \\ \vdots \\ \alpha^{(2\cdot59+1)\cdot(n-i)} \end{bmatrix} \quad (7)$$

Which means that if a decoder input codeword r contains errors in locations j,k,m, then $\underline{r}H^T=\underline{c}H^T \ \underline{e}H^T=\underline{e}H^T$, and by incorporating the error locations $\underline{e}H^T=\underline{s}_j+\underline{s}_k+\underline{s}_m$.

Soft Erasure Decoding of a Single Component Code—Overview

According to an embodiment of the invention, soft erasure decoding can be implemented for a single component codeword, i.e. single component codeword as described herein. Next sub-section discloses soft-erasure decoding in the scope of multi-dimensional codes. The following method is used for a syndrome based decodable code (e.g. BCH) and a single component codeword. Consider a codeword, where soft information is available per bit, and denoted by $LLR(r_i)$, where the LLR sign is the hard decision, and its reliability is given by $|LLR(r_i)|$.

Assume a codeword length n, and payload size k, for which the redundancy size is V=n−k. For a BCH code which corrects t errors, over $GF(2^Q)$, the redundancy size is V=t·Q.

The first decoder step is to compute the syndrome of the decoder input in order to check if the input codeword has errors, that is $$\underline{s}_{in} = \underline{r} \cdot H^T = \Sigma_{m=1}^{n} r_m \cdot \underline{s}_m \quad (8)$$

Where $\underline{s}_m$ is the V×1 column vector impact syndrome of $m^{th}$ codeword bit. When $\underline{s}_m \neq \underline{0}$ there exist errors.

The second decoding step requires sorting the codeword indices in ascending order of $\{|LLR(r_i)|\}_{i=1}^n$, the codeword indices with lowest |LLR| are those most likely to contain errors. If, for example, there are two errors sorted locations i,j of the sorted codeword then $$\underline{s}_{in} = \underline{s}_i + \underline{s}_j \quad (9)$$

In order to locate these error indices, the decoder can create a syndrome matrix for inversion by $$S_V = [\underline{s}_1 \underline{s}_2 \ldots \underline{s}_V] \quad (10)$$

Where $S_V$ is a V×V syndrome matrix of the V impact syndromes which correspond to the lowest |LLR| values. Hence, for computing an error location indicator vector, the following matrix inversion is needed $$\underline{e} = S_V^{-1} \cdot \underline{s}_{in} \quad (11)$$

Where according to said example the error indicator vector will have one in locations i,j and zeros in all over locations—which are the error locations in this example. However, in some cases there may be errors on codeword indices higher than V, i.e. which are not included in the syndrome matrix for inversion, in such case the error location indicator $\underline{e}$ will lead to a valid codeword, which is a false correction.

Consider the example where the error locations of the sorted codeword are located in i,j,u,V+1, which means that 3 errors are within the inverted syndrome matrix, $S_V$ while another errors is located in index V+1. In this case, the correct error indicator within the lowest |LLR| indices is given by $$\underline{e} = S_V^{-1} \cdot (\underline{s}_{in} + \underline{s}_{V+1}) \quad (12)$$

Where error location indicator $\underline{e}$ will contain '1' in locations i,j,u of the sorted codeword. In order to have the decoder arrive at this solution it is required to perform an enumeration over error hypotheses in location indices i>V, for every error hypothesis the error location indicator e is computed. The maximum-likelihood (ML) solution is the solution with lowest sum-LLR, i.e. the sum-LLR score of the error in the current example is $$sumLLR_e = |LLR(r_i)| + |LLR(r_j)| + |LLR(r_u)| + |LLR(r_{V+1})| \quad (13)$$

The $sumLLR_e$ is the sum of absolute values of LLRs corresponding to the actual error locations is the sorted codeword. The soft erasure decoder enumerates over most likely hypotheses of code indices greater than V and computes the sum-LLR for every hypothesis. The output of this erasure decoder is the M-best candidate error vectors with lowest sum-LLR found during the enumeration.

Sometimes the syndrome matrix $S_V$ of the V indices of a sorted codeword is not invertible (i.e. is singular). Therefore, as another embodiment of this invention, the matrix $S_V$ is the first non-singular syndrome matrix for V indices with lowest LLRs.

This can be obtained in the following steps:
1) From the sorted codeword choose the impact syndrome vector $\underline{s}_1$ corresponding to the bit with lowest |LLR|, this is the initial state of $S_V$.
2) Add another impact syndrome vector to $S_V$, which has lowest |LLR|, and was not included in $S_V$ nor it was discarded yet. Check the rank of $S_V$:
   i. If $S_V$ is full rank (i.e. rank is equal to smallest dimension size) then keep $S_V$. If the rank of $S_V$ is also V, then $S_V$ is non-singular and inversion can be done, otherwise repeat stage 2.
   ii. If $S_V$ is not full rank, discard the most recent impact syndrome (which was just added), and repeat stage 2.

Rank testing and syndrome matrix inversion can be done via Gaussian elimination.

Generally speaking, it is possible to find a non-singular $S_V$ for any sorted codeword within a low complexity, i.e. limited number of replacement for dependent impact syndrome vectors. For any practical implementation the number of possible replacement is defined by MAX_TH threshold (which has to be smaller than k). If it reaches k the search for a non-singular syndrome matrix terminates and fails.

The result of generating a syndrome matrix $S_V$ according to the steps above may be that the codeword bits for which impact syndromes are included in $S_V$ are not the lowest |LLR|'s, but the best |LLR| ordered bits which also generate a non-singular $S_V$. The codeword indices which are not in $S_V$ are sorted. Then an enumeration is done according to an increasing sum-LLR of candidate indices not included in $S_V$. For every error hypothesis h with locations the error locations within $S_V$ are computed as follows $$\underline{e}_h = S_V^{-1} \cdot (\underline{s}_{in} + \Sigma_{i=1}^P \underline{s}_{V+i}) \quad (14)$$

With a corresponding sum-LLR score of hypothesis h is $$sumLLR_h = \Sigma i = \Sigma^V |LLR(r_i)| \cdot \underline{e}_h(i) + \Sigma_{i=1}^P |LLR(r_{V+i})| \quad (15)$$

The soft erasure decoder may provide as an output the M-best scores, i.e. the M solutions with lowest $sumLLR_h$. The multi-dimensional decoding process may consider accepting or rejecting the solution with the best score from each soft erasure decoder of a component codeword.

This component decoding flow may be used for every packet in a dimension within the multi-dimensional soft decoding.

In order have a meaningful impact of every accepted correction during the per component decoding, the decoder may use a mechanism of LLR clipping, which changes to values of the LLRs within the corrected component code to a maximal value, such that the soft decoder of other components is not likely to change any of the bits which belong to an already corrected component code, like introduced in U.S. patent application Ser. No. 12/509,748 filing date Jul. 27, 2009 titled ENCODING METHOD AND SYSTEM, DECODING METHOD AND SYSTEM and U.S. Pat. No. 8,341,502 titled SYSTEM AND METHOD FOR MULTI-DIMENSIONAL DECODING.

Hard and Soft Combined Decoding

Multi-dimensional codes for the NAND flash memory systems are utilized here for their promise in reliability at high endurance, together with a low latency. In order to achieve lowest latency a single read operation is usually carried out, and hard decoding is used to recover the original data. In cases that hard decoding fails a soft-sampling and decoding has to be used.

In order to achieve very low decode latency, according to an embodiment of this invention, fast soft-decoding is done while using hard decoding of some components of the multi-dimensional code.

According to embodiments of the invention it is suggested to use fast activations of hard decoding along with embedded soft decoding operations which minimize the decoding complexity such that reliable decoding can be achieved within a limited latency.

Figure 6:
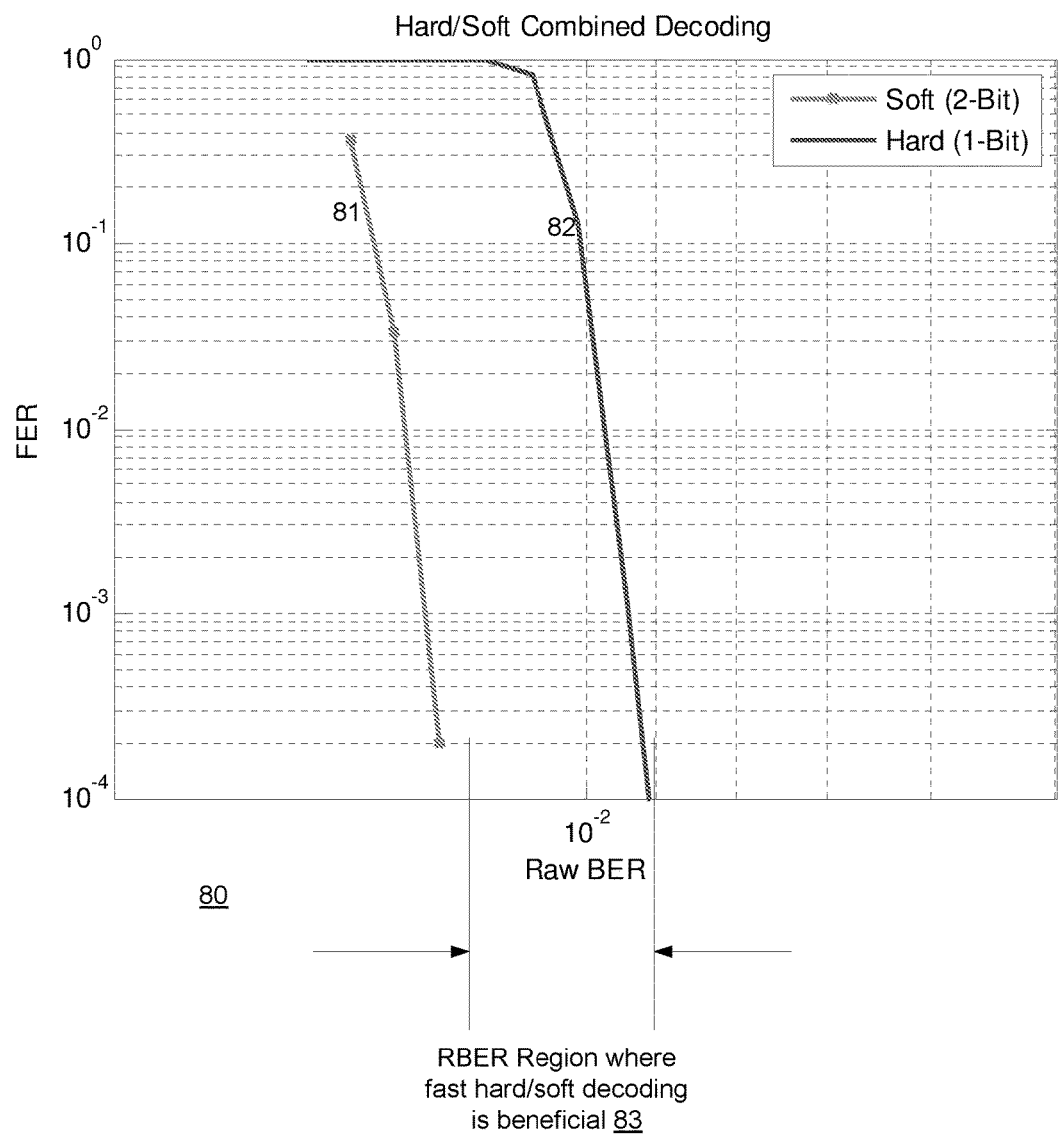
FIG. 6 illustrates demonstrates the decoding frame error rate (FER) versus the raw bit error rate (RBER) of a codeword.

FIG. 6 includes graph 80 that demonstrates the decoding frame error rate (FER) versus the raw bit error rate (RBER) of a codeword. In this example, the codeword size is 8 KB and the code rate is 0.9. The first curve 81 shows the FER of hard only decoding, while the second curve 82, which shows higher success rate for high RBER is the soft only decoding, where the input sampling resolution is 2-bits (corresponding to 3 read operations). In range 83 (between these curves) it may be seen that hard decoding may be successful with a relatively high probability, and therefore, in this region, when hard decoding fails it is very efficient to perform combined soft and hard decoding in terms of latency.

Figure 7:
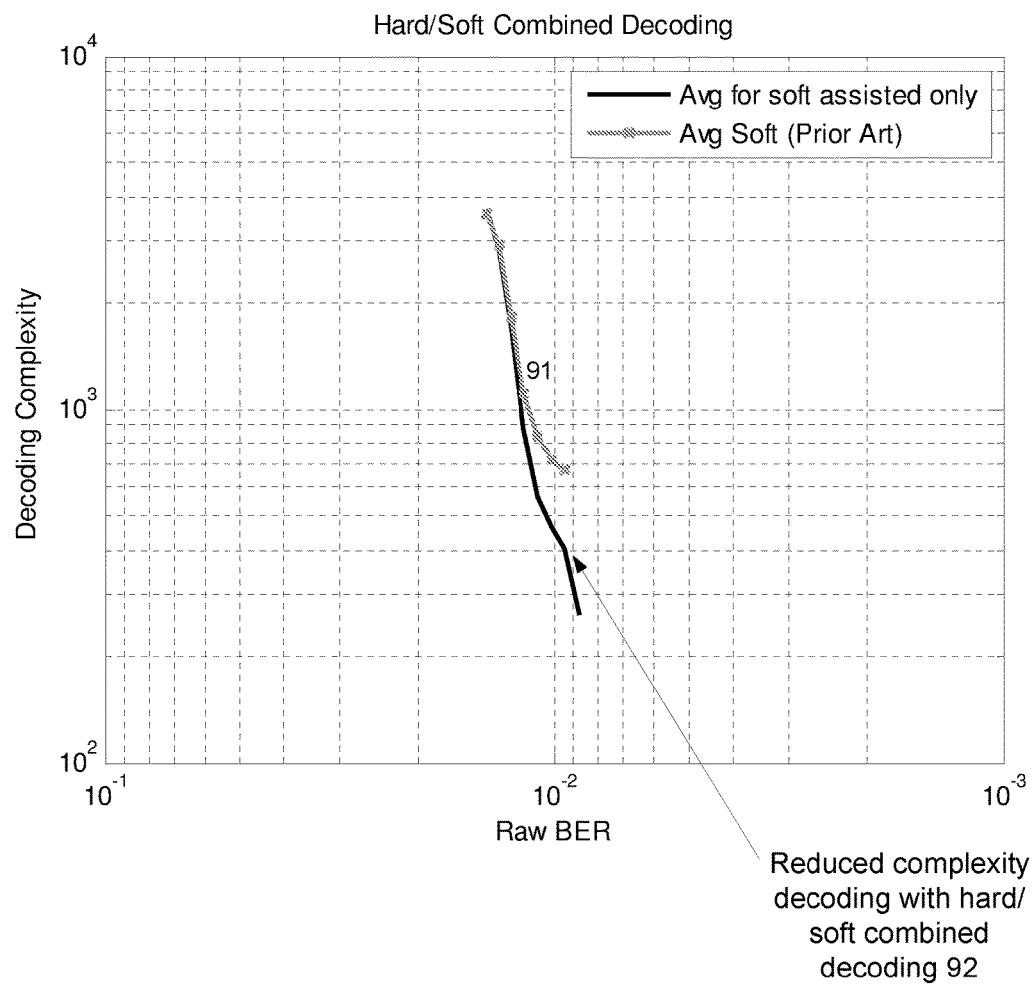
FIG. 7 illustrates a decoding complexity for cases where hard decoding only fails.

FIG. 7 includes graph 90 that compares between decoding complexity for cases where hard decoding only fails. In prior art (curve 91) the failure of hard decoding only is followed by soft decoding, while using embodiments of this invention the decoding complexity significantly reduces (curve 92), to more than twice.

According to an embodiment of the invention when a single read was done, and only hard input is available to the decoder, the decoder attempts full hard decoding effort (utilizing all elements of decoder capabilities). When using multi-bit sampling and performing combined hard/soft decoding the hard decoding may be configured to activate only the fast decodable components, e.g. perform components of D1 and D2 dimensions decoding only.

Figure 8:
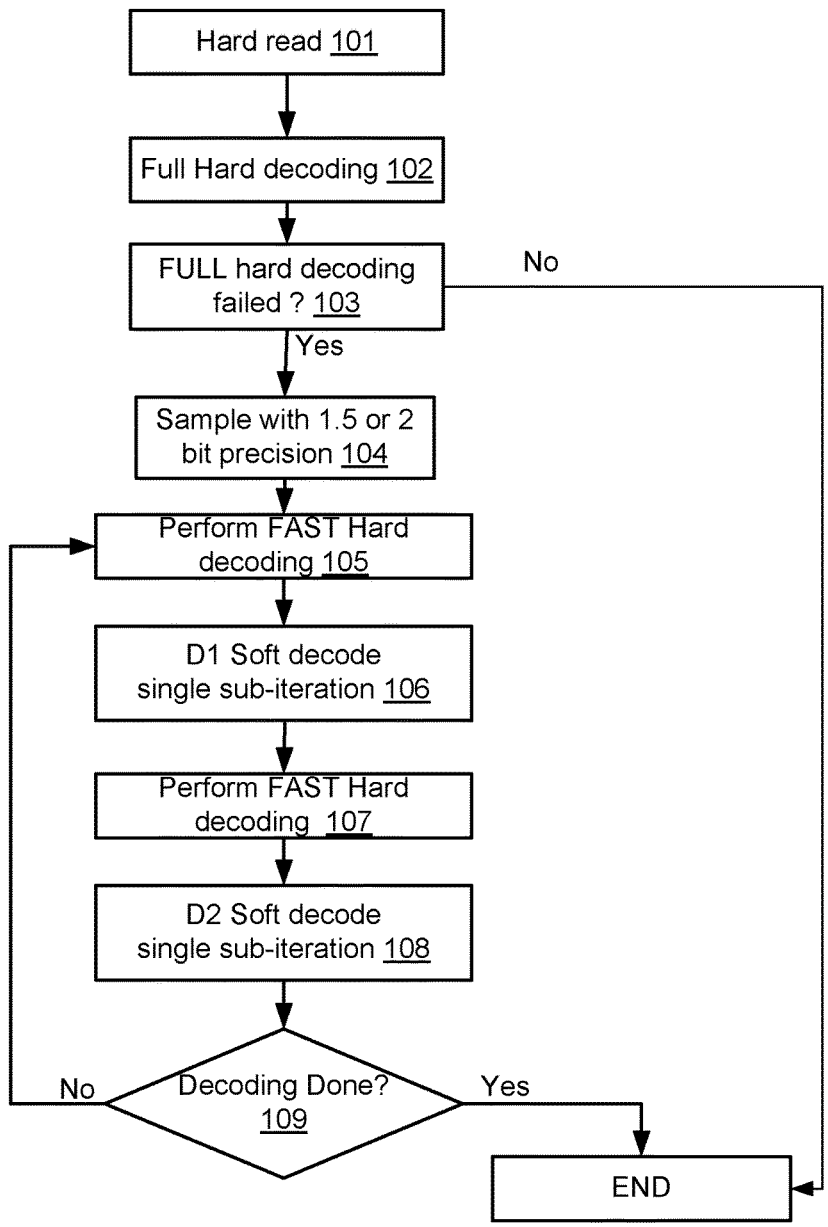
FIGS. 8-12 illustrate various methods according to various embodiments of the invention.
Figure 9:
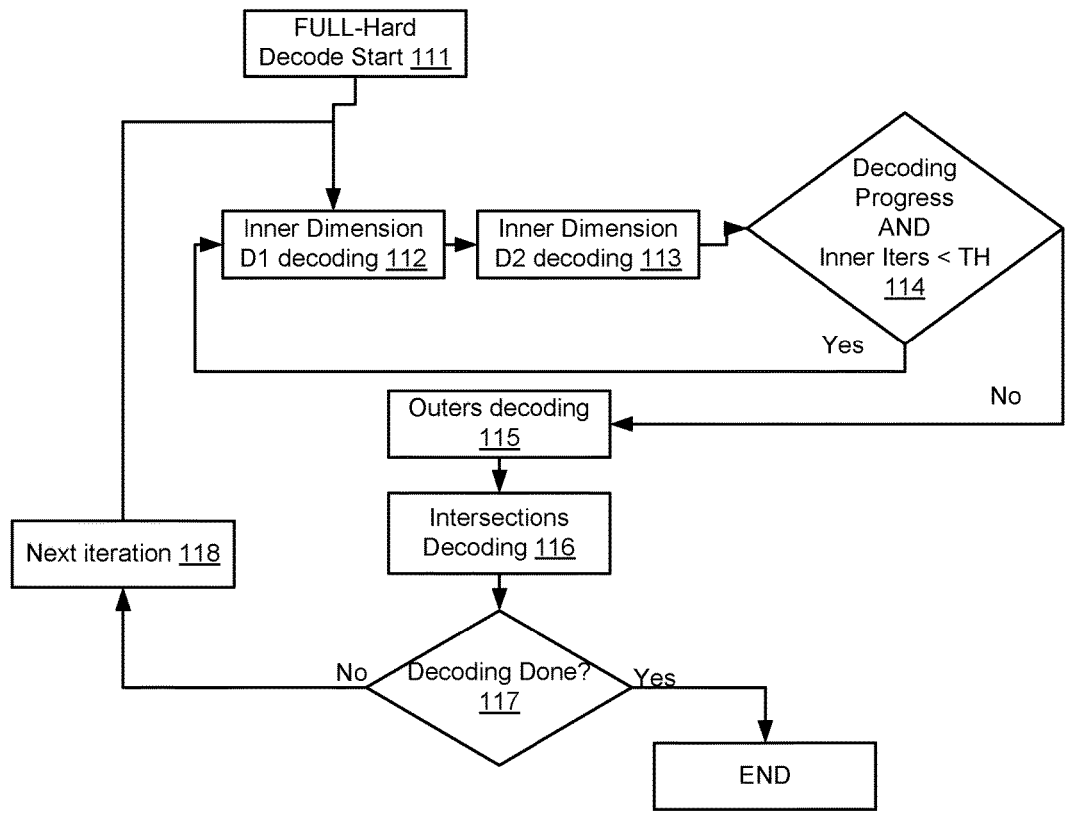

Error! Reference source not found. FIG. 8 illustrates method 100 according to an embodiment of the invention.

Method 100 includes a hard read (101) followed by full hard decoding (102). Step 103 checks if the hard decoding failed. If no—the method ends. Else (the hard decoding failed) the method proceeds to step 104 of 1.5 or 2 bit resolution sampling to generate decoder input. The input may first used by the hard decoder to recover as many errors as possible via fast hard decoding attempt (105). Then a soft sub-iteration is done (106), where only non-solved component codes undergo soft decoding. The result is used by the fast hard decoder again (107) to attempt further decoding progress. The fast hard decoding uses the hard decision values of the soft decoding operations, which was applied to some component codes, and during hard decoding it modifies the hard bits only (changing for example the LLR sign).

If not successful yet, then another soft decoding sub-iteration (108) on a different dimension is done. This decoding flow repeats until decoding done (step 108 is followed by step 109 checking of the decoding is done- and if not jumping to step 105).

Since the RBER region is around the hard fail region, the hard decoding iterations are highly efficient, and require only a small involvement of the soft decoding. This provides a significant decoding performance gain over the straight-forward soft decoding.

The fast hard decoding iteration is demonstrated in FIG. 7.

According to embodiments of the invention, only fast decodable component codes are use for this hard decoding flow.

The flow (110) starts at START step 111 that is followed by decoding (112) over dimension D1, followed by decoding (113) of dimension D2, and repeating this (step 114 checks the end conditions) until there is no decoding progress, or the number of iterations reaches a threshold STH. If the component code is a BCH code which corrects up to t≤4 errors, then the decoding can be implemented very efficiently, meaning that component hard decoding can be done within a single clock cycle. This gives motivation for using the hard decoding iterations in the flow of soft decoding.

Step 114 may be followed by step 112.

If the decoding does not progress and/or the number of inner iterations still did not exceed a threshold TH then step 114 may be followed by optional steps 115 of outer decoding and/or step 116 intersections decoding.

Steps 115 and 116 may be followed by step 117 of checking if the decoding is done—and if not jumping (next iteration 118) to step 112.

According to embodiments of the invention, the decision of using the component decoding results of the fast hard decoding may be according to the sum-LLR of the solution candidate. That is, for a solution of T bits for component code h, the sum-LLR is given by $$\text{sumLLR}_h = \Sigma_{i=1}^{T} |\text{LLR}(r_i)| \tag{16}$$

And the following test may be done $$\text{sumLLR}_h < \text{STH}? \tag{17}$$

If condition (17) is satisfied, then the solution of the hard decoder for component code h may be implemented. This testing within hard decoding is possible, since there is soft information per bit from the sampling done for this flow.

Figure 10:
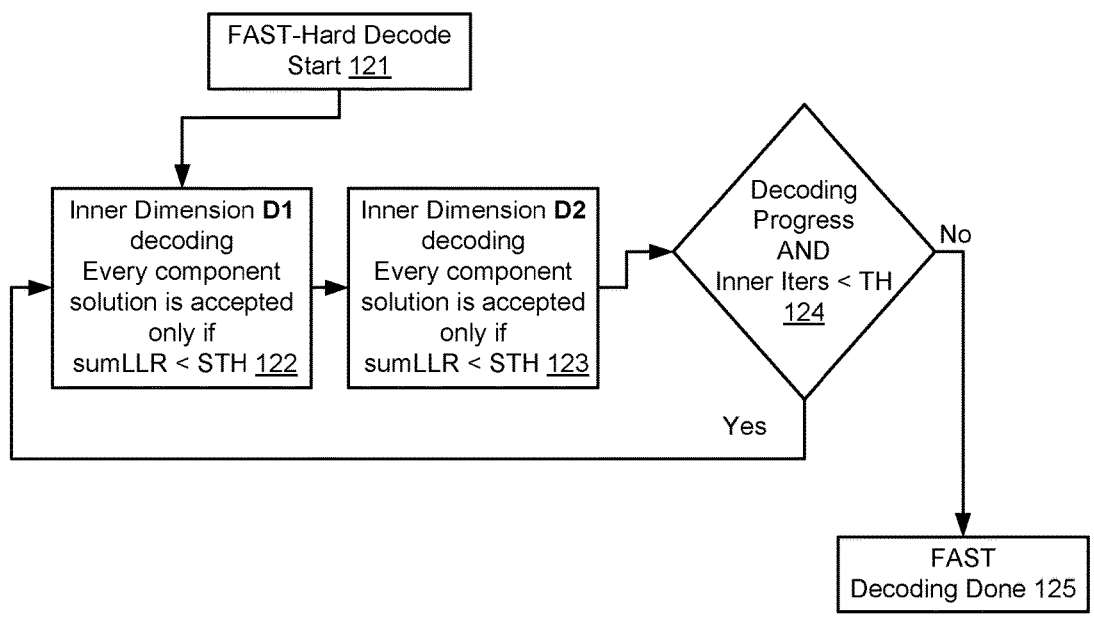

The flow of hard decoding of D1 and D2 as given in example flow of FIG. 10 may be executed as long as there is decoding progress of the hard decoding of D1 and D2, or until the max number of iterations.

The flow 120 starts at step 121 and is followed by step 122 of inner dimension D1 decoding wherein every component solution is accepted only if sumLLR <STH. Step 122 may be followed by step 123 of inner dimension D2 decoding wherein every component solution is accepted only if sumLLR <STH. Step 123 may be followed by step 124 of checking if there had been a decoding progress and if Inner iters <TH. If no—ending the fast decoding (125). Else—jumping to step 122.

According to another embodiment of the invention, the threshold STH may be modified every iteration within the fast-hard decoding iterations. For example, for a first iteration which includes D1 and D2 assign STH=2, for the second iteration of D1 and D2 decoding assign STH=3, etc. In such strategy more and more solutions will be obtained and implemented with fast hard decoding.

Figure 11:
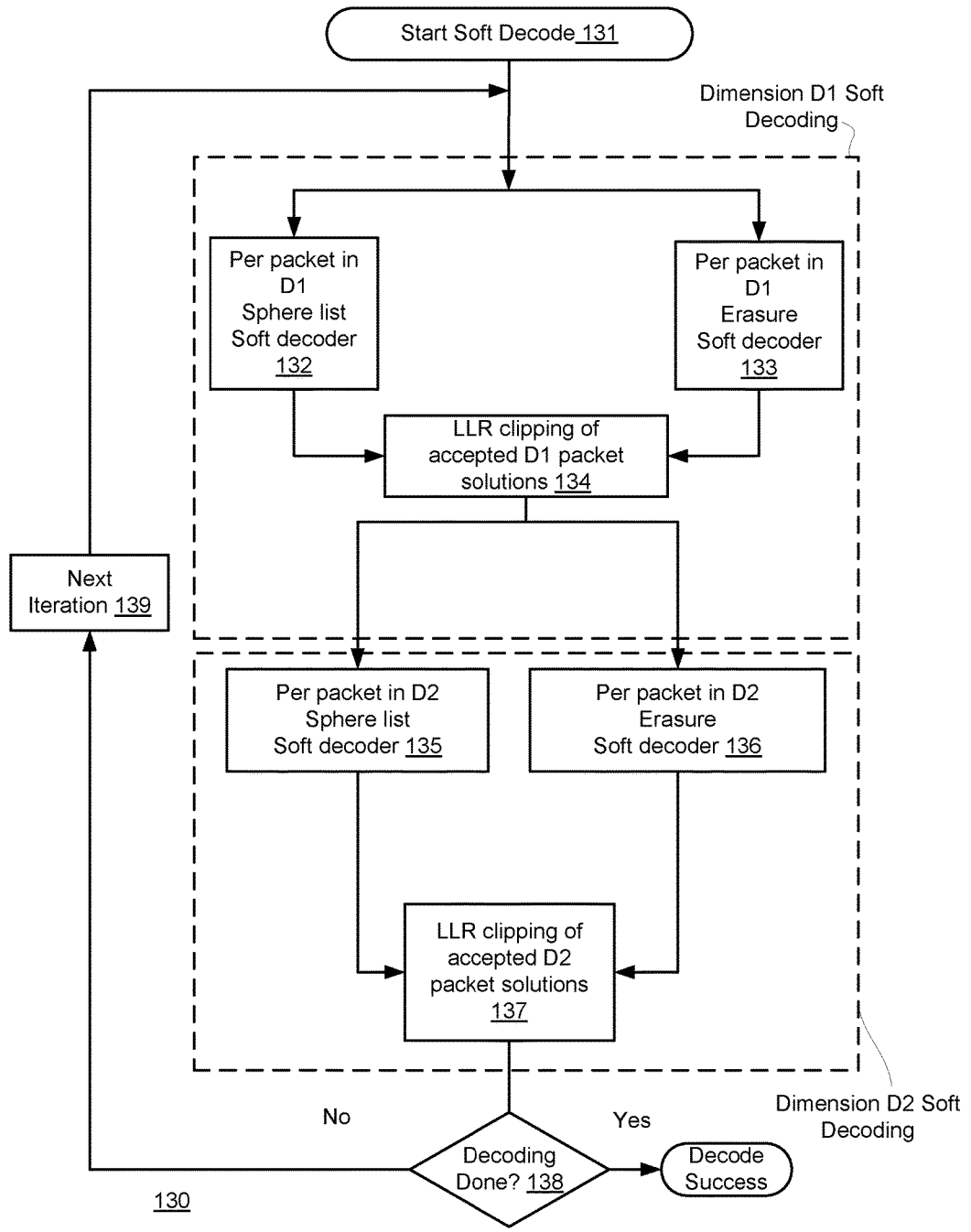

FIG. 11 illustrates a method 130 soft decoding according to an embodiment of the invention.

Method 130 may start at step 131 (START).

Step 131 may be followed by dimension D1 soft decoding.

The dimension D1 soft decoding includes step 132 and/or step 133. Steps 132 and 133 may be followed by step 134.

Step 132 includes performing, per packet in D1, sphere list soft decoding.

Step 133 includes performing, per packet in D1, erasure soft decoding.

Steps 132 and 133 may be followed by step 134 of LLR clipping of accepted D1 packet solutions.

The dimension D1 soft decoding may be followed by dimension D2 soft decoding.

The dimension D2 soft decoding includes step 135 and/or step 136.

Steps 135 and 136 may be followed by step 137.

Step 135 includes performing, per packet in D2, sphere list soft decoding.

Step 136 includes performing, per packet in D2, erasure soft decoding.

Steps 135 and 136 may be followed by step 137 of LLR clipping of accepted D2 packet solutions. According to an embodiment of the inventionM step 137 may be followed by step 131—when the decoding is not completed.

Figure 12:
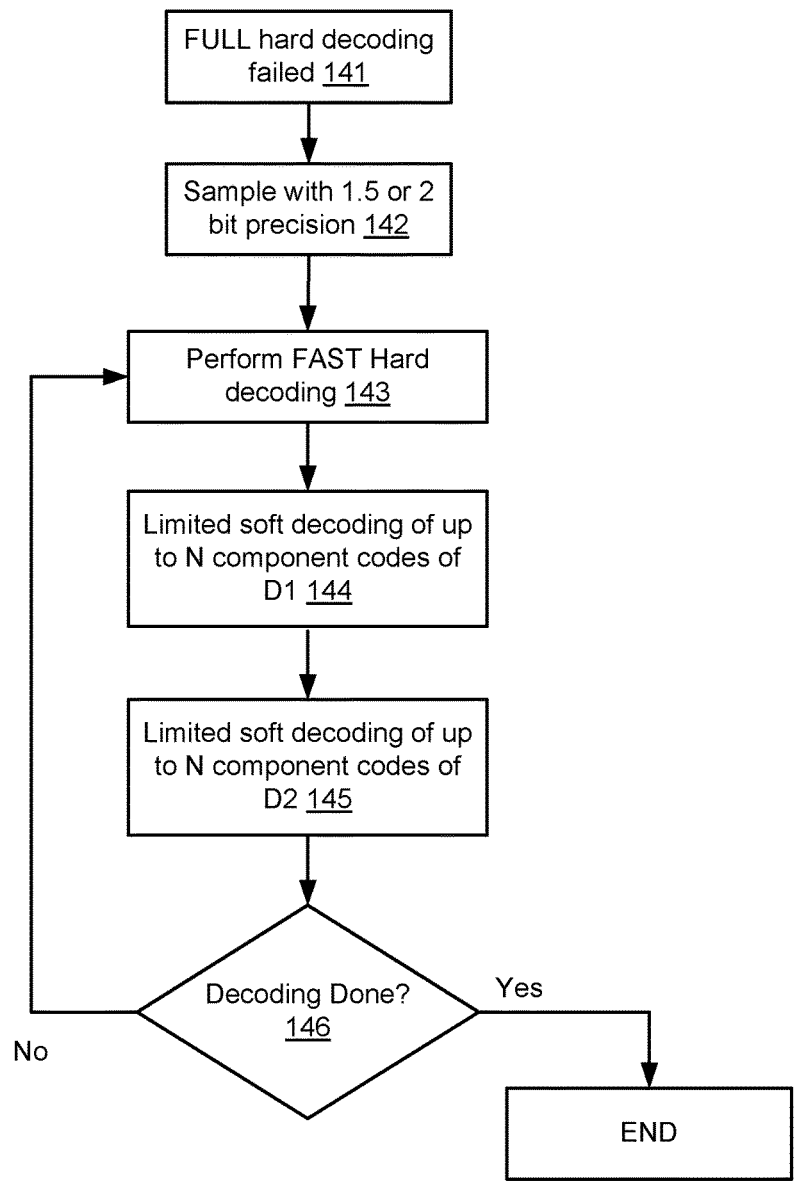

Another embodiment of this invention is exemplified in FIG. 12. The decoding flow 140 includes a hard decoding which failed (141), followed by 1.5 or 2 bit resolution sampling (142) to generate decoder input.

The input may first used by the hard decoder to recover as many errors as possible via fast hard decoding attempt (see FIG. 8). Following fast-hard, if decoding is not successful yet, a soft sub-iteration is done (step 144 of D1 and step 145 of D2), according to an embodiment of this invention only non-solved component codes undergo soft decoding and the number of components for performing soft decoding is limited to N. For example, if there are 80 unsolved packets in D1, the soft decoding may be applied on N=20 packets only, and immediately continue with hard decoding. This will minimize the soft decoding time.

The decision on accepting solutions of a soft decoding result is specified in (4) and (15), where following the soft-decode enumeration the solution with the lowest sumLLR is accepted if its sumLLR is small enough, as tested in (17). It may also be tested in comparison to the next smallest sumLLR solution, this test verifies that the lowest sumLLR solution is also significant (and sufficiently far from the next best).

Thus accepted solutions may be defined according to these rules, and according to an embodiment of this invention a fast soft decoding is obtained by limiting the number of components with soft decoding to be N, or to be N accepted soft solutions.

That is, even if the number of components in a dimension is M where M>N, and the number of non-solved components before going to soft decoding is P where M>P>N, then solve no more than N packets, and attempt fast-hard decoding for further attempts. If not successful yet, then another soft decoding sub-iteration on a different dimension is done with the same limitation, followed by fast hard decoding. This decoding flow repeats until decoding done. Since the RBER region is around the hard fail region, the hard decoding iterations are highly efficient, and require only a small involvement of the soft decoding. This provides a significant decoding complexity and performance gain over the straightforward soft decoding.

According to another embodiment of this invention, the fast soft decoding can be obtained not only by limiting the number of solved components in soft to N, but by also dynamically limiting the number of enumerations in soft decoding. That is, start soft decoding of a component code and for every suggested solution compute the sumLLR score. When the sumLLR score satisfied a condition similar to (17), i.e. the sumLLR is smaller than a threshold, the solution is accepted and enumeration stops. Decoder then may continue to next component with soft decoding or continue to fast hard decoding according to state in the flow. In a special case where N=1, the minimal component soft decoding is obtained, while possibly increasing the number of fast-hard iterations, and thus achieving a very low complexity decoding.

According to another embodiment of this invention, the combined hard/soft decoding may be used even without attempting to perform full hard decode. That is, when the RBER range is known by the controller, it may decide to directly sample 1.5/2 bit soft samples, and begin a fast hard/soft combined decoding strategy.

Figure 13:
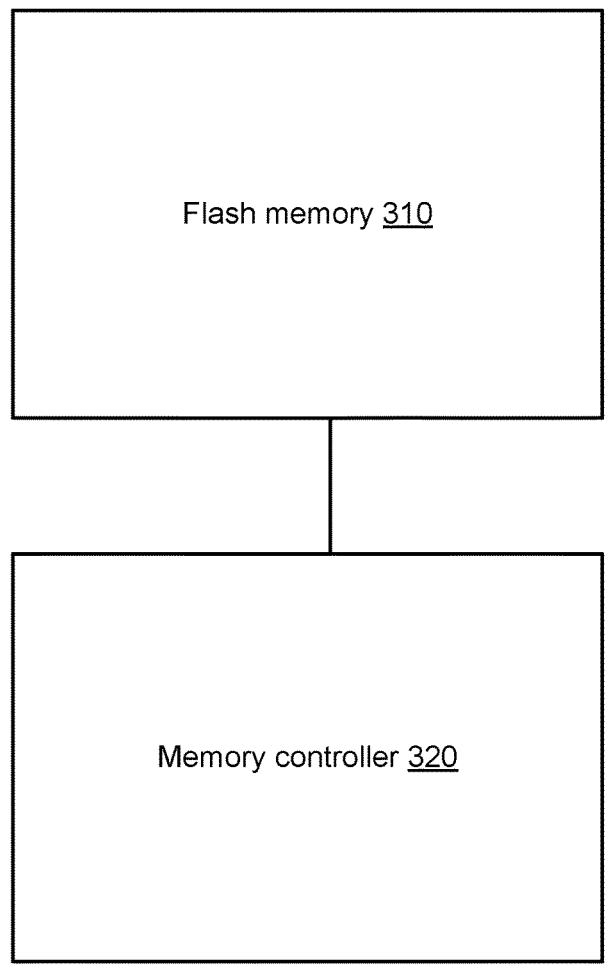
FIG. 13 illustrates a system according to an embodiment of the invention.

FIG. 13 illustrated a system 300 according to an embodiment of the invention.

System 300 includes a flash memory 310 and a memory controller 320. The system 300 is configured to execute any of the methods mentioned in this application. The flash memory 310 and the memory controller 320 may be integrated, may belong to different chips, and the like.

Figure 14:
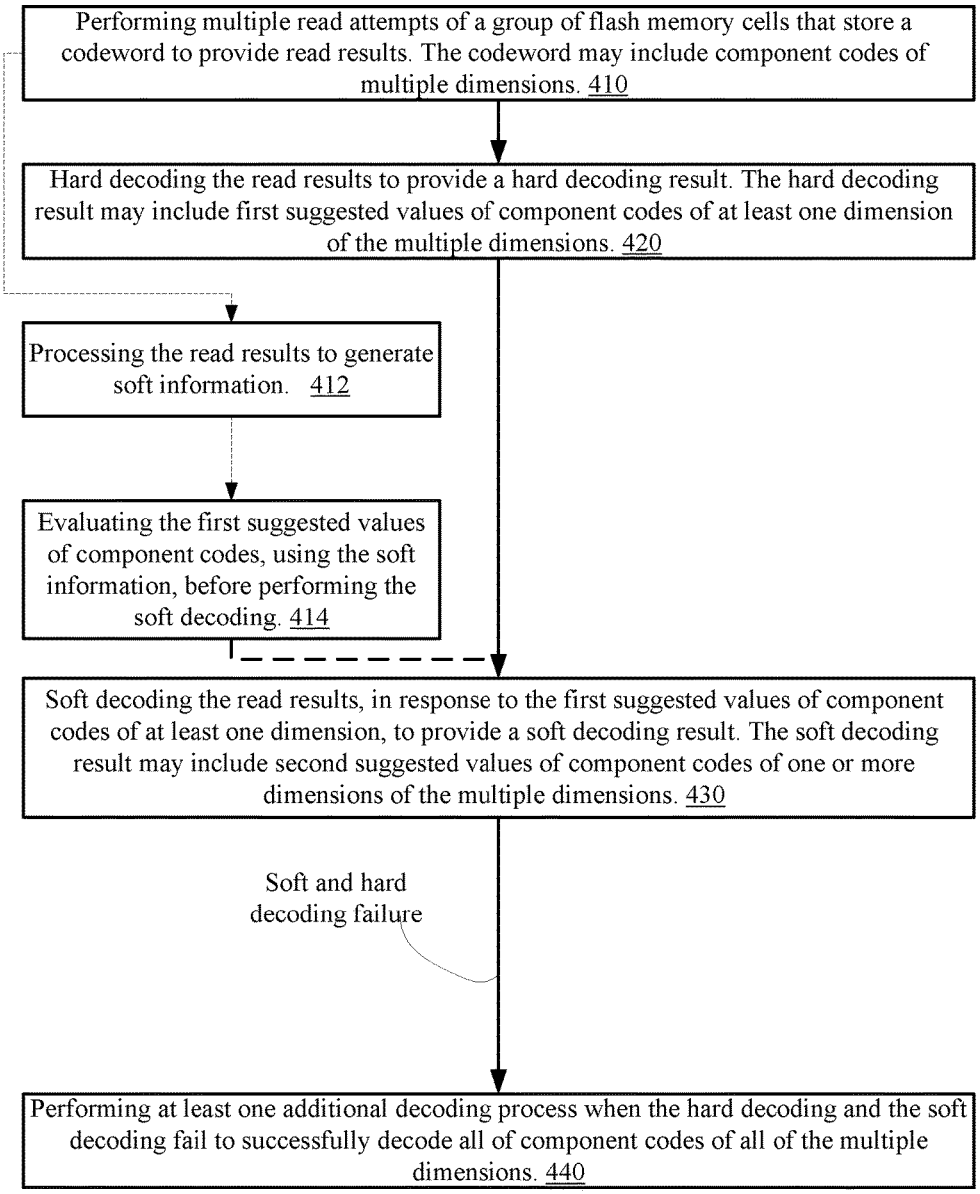
FIGS. 14-16 illustrate various methods according to various embodiments of the invention.

FIG. 14 illustrates method 400 according to an embodiment of the invention.

Method 400 is a method for fast decoding and may start by step 410 of performing multiple read attempts of a group of flash memory cells that store a codeword to provide read results. The codeword may include component codes of multiple dimensions. Non-limiting examples of such reading operations were illustrated in the previous figures and may include hard read and/or 1.5 bit or 2 sampling.

Step 410 may be followed by step 420 of hard decoding the read results to provide a hard decoding result.

The hard decoding result may include first suggested values of component codes of at least one dimension of the multiple dimensions.

Step 420 may be followed by step 430 of soft decoding the read results, in response to the first suggested values of component codes of at least one dimension, to provide a soft decoding result. The soft decoding may include limited soft decoding, the soft decoding of figure The soft decoding result may include second suggested values of component codes of one or more dimensions of the multiple dimensions.

When steps 420 and 430 fail (decoding was not successfully completed) method 400 may proceed to step 440 of performing at least one additional decoding process when the hard decoding and the soft decoding fail to successfully decode all of component codes of all of the multiple dimensions.

According to an embodiment of the invention, step 410 may also be followed by step 412 of processing the read results to generate soft information. Step 412 may be followed by step 414 of evaluating the first suggested values of component codes, using the soft information, before performing the soft decoding. The evaluating may include ignoring (deleting) first suggested values that are not reliable enough (reliability below a threshold).

Figure 15:
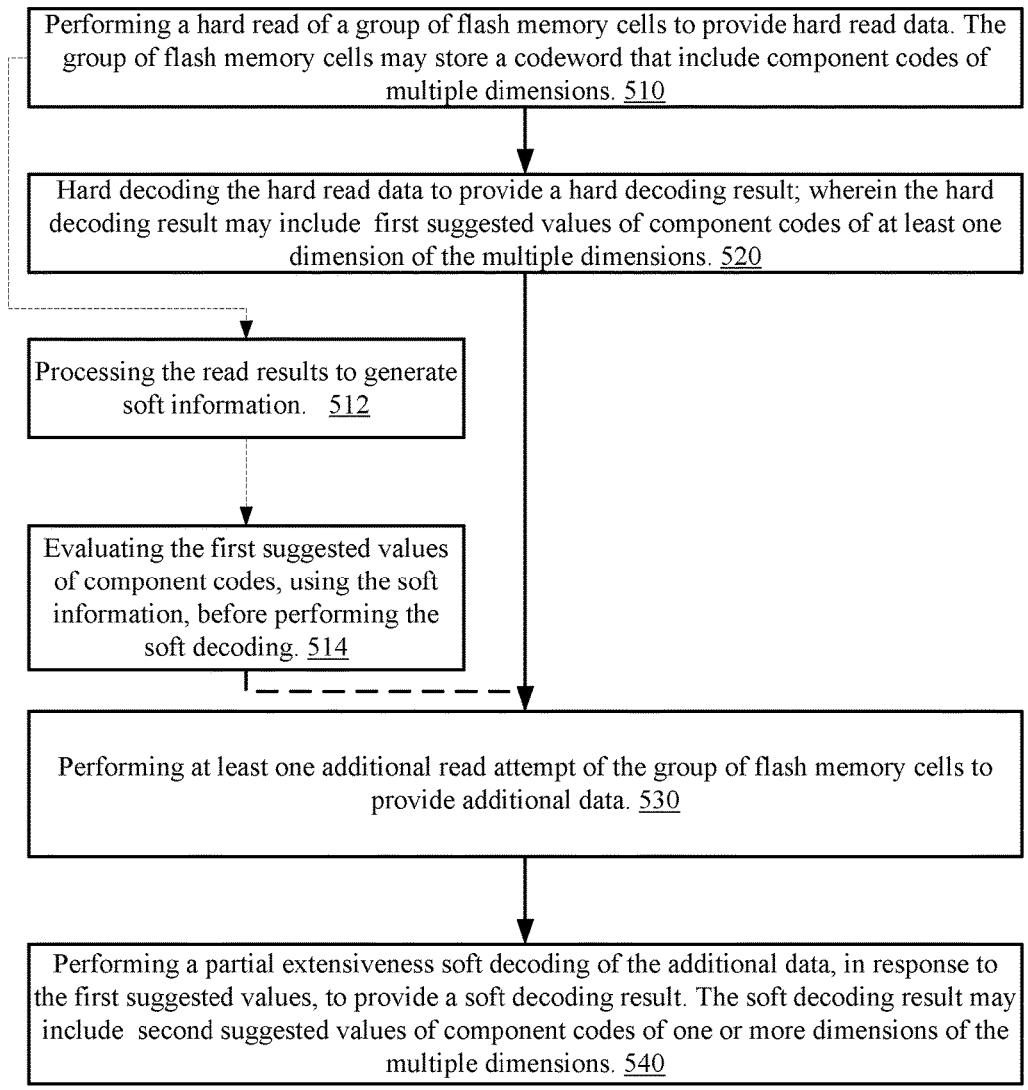

FIG. 15 illustrates method 500 according to an embodiment of the invention.

Method 500 is for fast decoding and may include a sequence of steps 510, 520, 530 and 540.

Step 510 may include performing a hard read of a group of flash memory cells to provide hard read data. For example—performing a hard read using thresholds T0-T6. The group of flash memory cells may store a codeword that include component codes of multiple dimensions.

Step 520 of hard decoding the hard read data to provide a hard decoding result; wherein the hard decoding result comprises first suggested values of component codes of at least one dimension of the multiple dimensions.

Figure 2:
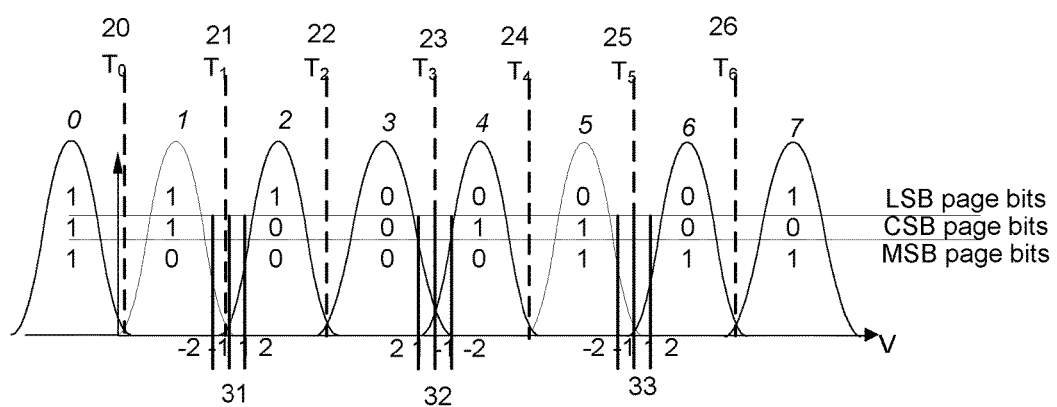
FIG. 2 illustrates a prior art threshold voltage distribution.

Step 530 of performing at least one additional read attempt of the group of flash memory cells to provide additional data. For example performing a 1.5 or 2 bit sampling—using additional read thresholds such as sampling thresholds 11, 12, 13 and 14 of FIGS. 1 and/or 31, 32 and 33 of FIG. 2.

Step 540 of performing a partial extensiveness soft decoding of the additional data, in response to the first suggested values, to provide a soft decoding result. The soft decoding result comprises second suggested values of component codes of one or more dimensions of the multiple dimensions.

The partial extensiveness soft decoding may include or be limited to, for example, one or two soft decoding sub-iterations, soft decoding only up to a predefined number of unreliable (N) component codes solutions, evaluating up to a predefined number L of hypotheses related to the content of an unreliable bits of the component codes. For L=100, the soft decoder evaluates up to 100 error hypotheses, where for each hypothesis, a score of sumLLR is computed (adhering to sphere list/erasure soft decoding/both), and the lowest sumLLR score is selected as the most likely solution. This type of soft decoding for a single component is applied to up to N components codes of a dimension, sphere list decoding and/or erasure soft decoding.

According to an embodiment of the invention, step 510 may also be followed by step 512 of processing the read results to generate soft information.

Step 512 may be followed by step 514 of evaluating the first suggested values of component codes, using the soft information, before performing the soft decoding. The evaluating may include ignoring (deleting) first suggested values that are not reliable enough (reliability below a threshold).

Figure 16:
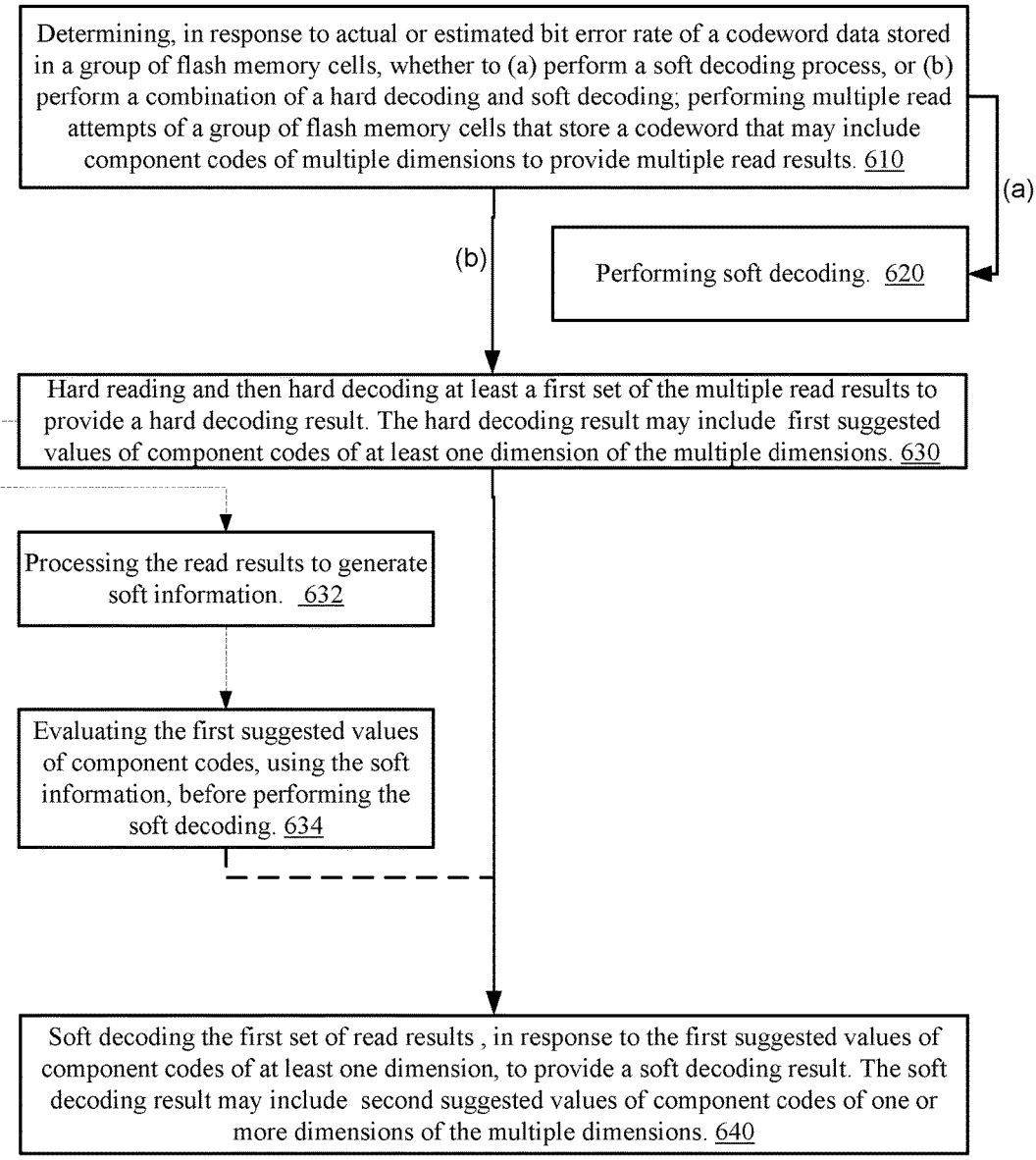

FIG. 16 illustrates method 600 according to an embodiment of the invention.

Method 600 is for fast decoding, and may start by step 610 of determining, in response to actual or estimated bit error (BER) rate of a codeword data stored in a group of flash memory cells, whether to (a) perform a soft decoding process, or (b) perform a combination of a hard decoding and soft decoding; performing multiple read attempts of a group of flash memory cells that store a codeword that comprises component codes of multiple dimensions to provide multiple read results. BER estimation may be derived for example from previously read codewords on the same physical block in the Flash. If the estimated BER>STH, then the hard decoding in combination with soft decoding may be not useful, and the controller may select performing soft sampling and soft decoding directly (a). If the estimated BER satisfies STH>BER>HTH, it implies that the estimated BER is in the range where hard alone is likely to fail, and combined hard soft decoding may be very effective, and therefore the selection is step (b). Usually. If BER<HTH, then only hard decoding is attempted, and if it fails, then combined hard soft will be carried out as in step (b).

When determining to perform the soft decoding then step 610 is followed by step 620 of performing soft decoding. Step 620 may include performing a full extensiveness soft decoding.

When determining to perform the combination then step 610 is followed by step 630 of hard reading and then hard decoding at least a first set of the multiple read results to provide a hard decoding result. The hard decoding result comprises first suggested values of component codes of at least one dimension of the multiple dimensions.

Step 630 may be followed by step 640 of soft decoding the first set of read results, in response to the first suggested values of component codes of at least one dimension, to provide a soft decoding result. The soft decoding result comprises second suggested values of component codes of one or more dimensions of the multiple dimensions.

According to an embodiment of the invention step 630 may also be followed by step 632 of processing the read results to generate soft information.

Step 632 may be followed by step 634 of evaluating the first suggested values of component codes, using the soft information, before performing the soft decoding. The evaluating may include ignoring (deleting) first suggested values that are not reliable enough (reliability below a threshold).

Figure 17:
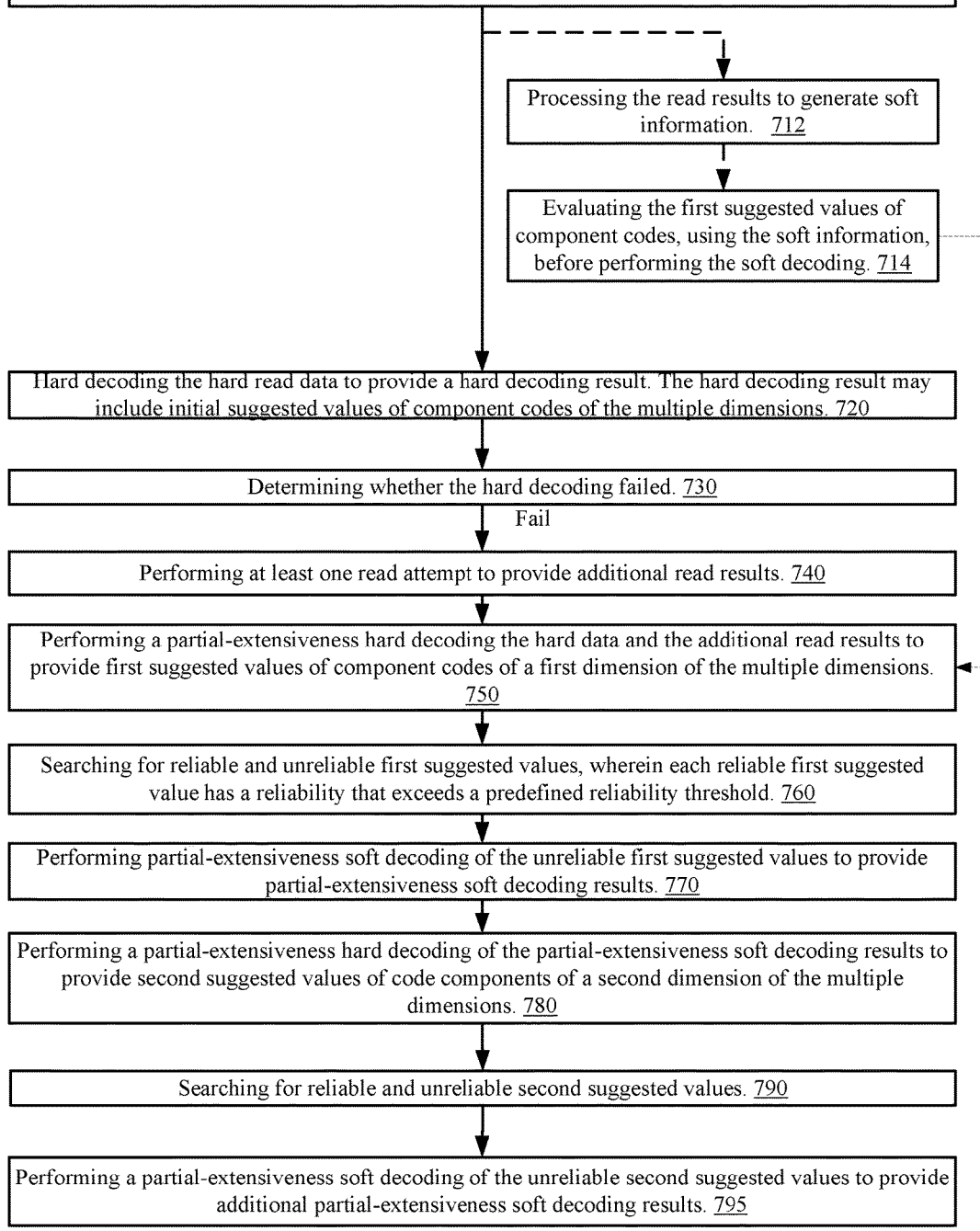
FIG. 17 illustrates a method according to various embodiments of the invention.

FIG. 17 illustrates method 700 according to an embodiment of the invention.

Method 700 may start by step 710 of performing hard read of a group of flash memory cells to provide hard read data. The group of flash memory cells stores a codeword that comprises component codes of multiple dimensions.

Step 710 may be followed by step 720 of hard decoding the hard read data to provide a hard decoding result. The hard decoding result may include initial suggested values of component codes of the multiple dimensions.

Step 720 may be followed by step 730 of determining whether the hard decoding failed.

When the hard decoding failed step 730 is followed by step 740 of performing at least one read attempt to provide additional read results.

Step 740 may be followed by step 750 of performing a partial-extensiveness hard decoding the hard data and the additional read results to provide first suggested values of component codes of a first dimension of the multiple dimensions.

Step 750 may be followed by step 760 of searching for reliable and unreliable first suggested values, wherein each reliable first suggested value has a reliability that exceeds a predefined reliability threshold.

Step 760 may be followed by step 770 of performing partial-extensiveness soft decoding of the unreliable first suggested values to provide partial-extensiveness soft decoding results.

Step 770 may be followed by step 780 of performing a partial-extensiveness hard decoding of the partial-extensiveness soft decoding results to provide second suggested values of code components of a second dimension of the multiple dimensions.

Step 780 may be followed by step 790 of searching for reliable and unreliable second suggested values.

Step 790 may be followed by step 795 of and performing a partial-extensiveness soft decoding of the unreliable second suggested values to provide additional partial-extensiveness soft decoding results.

According to an embodiment of the invention, step 710 may also be followed by step 712 of processing the read results to generate soft information.

Step 712 may be followed by step 714 of evaluating the first suggested values of component codes, using the soft information, before performing the soft decoding. The evaluating may include ignoring (deleting) first suggested values that are not reliable enough (reliability below a threshold).

Any reference to the term "comprising" or "having" should be interpreted also as referring to "consisting" of "essentially consisting of". For example—a method that comprises certain steps can include additional steps, can be limited to the certain steps or may include additional steps that do not materially affect the basic and novel characteristics of the method—respectively.

The invention may also be implemented in a computer program for running on a computer system, at least including code portions for performing steps of a method according to the invention when run on a programmable apparatus, such as a computer system or enabling a programmable apparatus to perform functions of a device or system according to the invention. The computer program may cause the storage system to allocate disk drives to disk drive groups.

A computer program is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on a non-transitory computer readable medium. All or some of the computer program may be provided on computer readable media permanently, removably or remotely coupled to an information processing system. The computer readable media may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc. A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system. The computer system may for instance include at least one processing unit, associated memory and a number of input/output (I/O) devices. When executing the computer program, the computer system processes information according to the computer program and produces resultant output information via I/O devices.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A method for fast decoding, the method comprising:
performing a hard read of a group of flash memory cells to provide hard read data; wherein the group of flash memory cells store a codeword that comprises component codes of multiple dimensions; wherein the group of flash memory cells have a threshold voltage distribution with a number of levels that is based on a storage capacity each cell in the group of flash memory cells; wherein the performing the hard read includes reading with threshold voltages, each threshold voltage being between two respective levels in the threshold voltage distribution;
hard decoding the hard read data to provide a hard decoding result; wherein the hard decoding result comprises first suggested values of component codes of at least one dimension of the multiple dimensions, wherein the hard decoding result includes unreliable component code solutions that do not exceed a reliability threshold;
performing at least one additional read attempt of the group of flash memory cells to provide additional data, wherein the performing the at least one additional read attempt includes reading with sampling thresholds around centers of at least one of the threshold voltages;
performing, subsequent to the performing the at least one additional read attempt and in response to the first suggested values, at least one sub-iteration of soft decoding of the additional data to provide a soft decoding result, wherein the at least one sub-iteration of soft decoding includes soft decoding fewer than all of the unreliable component code solutions; and
wherein the soft decoding result comprises second suggested values of component codes of one or more dimensions of the multiple dimensions.

2. The method according to claim 1, further comprising:
processing the hard read data to generate soft information; and
evaluating the hard decoding result using the soft information before performing the at least one sub-iteration of soft decoding.

3. The method according to claim 1, wherein the performing the at least one additional read attempt provides the additional data with 2 bit resolution.

4. The method according to claim 1, wherein the performing the at least one additional read attempt provides the additional data with 1.5-bit resolution.

5. The method according to claim 1, wherein the performing the at least one sub-iteration of soft decoding comprises performing a single sub-iteration of soft decoding.

6. The method according to claim 1, wherein the performing the at least one sub-iteration of soft decoding comprises soft decoding up to a predefined number of unreliable component codes solutions, wherein the unreliable component codes solutions are below a reliability threshold.

7. The method according to claim 1, wherein the performing the at least one sub-iteration of soft decoding comprises evaluating up to a predefined number of hypotheses related to a content of an unreliable component code solution, wherein the unreliable component code solution is below a reliability threshold.

8. The method according to claim 1, wherein a number of the sampling thresholds is three.

9. The method according to claim 1, wherein a number of the sampling thresholds is four.

10. A method for fast decoding, the method comprises:
performing a hard read of a group of flash memory cells to provide hard read data; wherein the group of flash memory cells store a codeword that comprises component codes of multiple dimensions; wherein the group of flash memory cells have a threshold voltage distribution with a number of levels that is based on a storage capacity each cell in the group of flash memory cells; wherein the performing the hard read includes reading with threshold voltages, each threshold voltage being between two respective levels in the threshold voltage distribution;
performing a first hard decoding of the hard read data to provide a hard decoding result; wherein the hard decoding result comprises initial suggested values of component codes of the multiple dimensions;
determining whether the hard decoding failed based on whether or not the initial suggested values exceed a first reliability threshold;
performing, when the first hard decoding fails, at least one read additional attempt to provide additional read results; wherein the at least one additional read attempt includes reading with sampling thresholds around centers of at least one of the threshold voltages;
performing a second hard decoding of the hard data and the additional read results to provide first suggested values of component codes of a first dimension of the multiple dimensions;
searching for reliable and unreliable first suggested values, wherein each reliable first suggested value has a reliability that exceeds a predefined first reliability threshold;
wherein each unreliable first suggested value does not exceed the predefined first reliability threshold;
performing, subsequent to the performing the at least one additional read attempt and in response to the unreliable first suggested values, a first partial-extensiveness-soft decoding of the unreliable first suggested values to provide first partial-extensiveness soft decoding results; wherein the first partial-extensiveness soft decoding includes soft decoding fewer than all of the unreliable first suggested values;
performing a third hard decoding of the first partial-extensiveness soft decoding results to provide second suggested values of code components of a second dimension of the multiple dimensions; wherein the second suggested values include values that do not exceed a second reliability threshold;
searching for reliable and unreliable second suggested values; wherein each reliable second suggested value exceeds a predefined second reliability threshold, and each unreliable second suggested value does not exceed the predefined second reliability threshold; and
performing a second partial-extensiveness soft decoding of the unreliable second suggested values to provide additional partial-extensiveness soft decoding results;
wherein the second partial-extensiveness soft decoding includes soft decoding fewer than all of the unreliable second suggested values.

11. The method according to claim 10, further comprising:
processing the hard read data to generate soft information; and
evaluating the hard decoding result using the soft information before performing the first partial-extensiveness soft decoding.

12. The method according to claim 10, wherein the performing the at least one additional read attempt provides the additional read results with 2 bit resolution.

13. The method according to claim 10, wherein the performing the at least one additional read attempt provides the additional read results with 1.5-bit resolution.

14. The method according to claim 10, wherein at least one of the first and second the partial-extensiveness soft decoding comprises performing a single sub-iteration of soft decoding.

15. The method according to claim 10, wherein at least one of the first and second the partial-extensiveness soft decoding comprises evaluating up to a predefined number of hypotheses related to a content of an unreliable component code solution.

16. The method according to claim 10, wherein the performing of at least one of the second and third hard decoding comprises performing one or more iterations of hard decoding related to different dimensions while decoding progress is made and a number of iterations does not exceed a predefined iteration threshold.

17. A non-transitory computer readable medium that stores instructions that once executed by a memory controller cause the memory controller to execute the steps of:
performing a hard read of a group of flash memory cells to provide hard read data; wherein the group of flash memory cells store a codeword that comprises component codes of multiple dimensions; wherein the group of flash memory cells have a threshold voltage distribution with a number of levels that is based on a storage capacity each cell in the group of flash memory cells; wherein the performing the hard read includes reading with threshold voltages, each threshold voltage being between two respective levels in the threshold voltage distribution;
performing a first hard decoding of the hard read data to provide a hard decoding result; wherein the hard decoding result comprises initial suggested values of component codes of the multiple dimensions;
determining whether the hard decoding failed based on whether or not the initial suggested values exceed a first reliability threshold;
performing, when the first hard decoding fails, at least one read additional attempt to provide additional read results; wherein the at least one additional read attempt includes reading with sampling thresholds around centers of at least one of the threshold voltages;
performing a second hard decoding of the hard data and the additional read results to provide first suggested values of component codes of a first dimension of the multiple dimensions;
searching for reliable and unreliable first suggested values, wherein each reliable first suggested value has a reliability that exceeds a predefined first reliability threshold;
wherein each unreliable first suggested value does not exceed the predefined first reliability threshold;
performing, subsequent to the performing the at least one additional read attempt and in response to the unreliable first suggested values, a first partial-extensiveness-soft decoding of the unreliable first suggested values to provide first partial-extensiveness soft decoding results; wherein the first partial-extensiveness soft decoding includes soft decoding fewer than all of the unreliable first suggested values;
performing a third hard decoding of the first partial-extensiveness soft decoding results to provide second suggested values of code components of a second dimension of the multiple dimensions; wherein the second suggested values include values that do not exceed a second reliability threshold;
searching for reliable and unreliable second suggested values; wherein each reliable second suggested value exceeds a predefined second reliability threshold, and each unreliable second suggested value does not exceed the predefined second reliability threshold; and
performing a second partial-extensiveness soft decoding of the unreliable second suggested values to provide additional partial-extensiveness soft decoding results; wherein the second partial-extensiveness soft decoding includes soft decoding fewer than all of the unreliable second suggested values.

18. The non-transitory computer readable medium according to claim 17, further comprising instructions for:
processing the hard read data to generate soft information; and
evaluating the hard decoding result using the soft information before performing the first partial-extensiveness soft decoding.

19. The non-transitory computer readable medium according to claim 17, wherein at least one of the first and second partial-extensiveness soft decoding comprises performing a single sub-iteration of soft decoding.

20. The non-transitory computer readable medium according to claim 17, wherein a number of the sampling thresholds is three or four.

* * * * *